United States Patent
Gale et al.

(10) Patent No.: US 9,940,976 B1
(45) Date of Patent: Apr. 10, 2018

(54) DATA STORAGE LIBRARY WITH COMPONENT LOCKER FOR ENVIRONMENTAL ACCLIMATION

(71) Applicant: International Business Machines Corporation, Armonk, NY (US)

(72) Inventors: Ernest S. Gale, Tucson, AZ (US); Icko E. T. Iben, Santa Clara, CA (US); Leonard G. Jesionowski, Tucson, AZ (US); James M. Karp, Tucson, AZ (US); Michael P. McIntosh, Tucson, AZ (US); Shawn M. Nave, Tucson, AZ (US); Lee C. Randall, Tucson, AZ (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/460,389

(22) Filed: Mar. 16, 2017

(51) Int. Cl.
| | |
|---|---|
| *G11B 33/14* | (2006.01) |
| *G11B 5/008* | (2006.01) |
| *H05K 7/20* | (2006.01) |
| *G11B 15/68* | (2006.01) |
| *B65G 1/04* | (2006.01) |

(52) U.S. Cl.
CPC ........ *G11B 33/144* (2013.01); *G11B 5/00813* (2013.01); *G11B 15/68* (2013.01); *H05K 7/20* (2013.01); *B65G 1/0407* (2013.01)

(58) Field of Classification Search
CPC ... G11B 33/144; G11B 5/00813; G11B 15/68; G11B 15/689; H05K 7/20; B65G 1/0407
See application file for complete search history.

(56) References Cited

U.S. PATENT DOCUMENTS

| | | | |
|---|---|---|---|
| 4,838,911 A | 6/1989 | Robertson et al. | |
| 5,278,708 A | 1/1994 | Apple et al. | |
| 5,449,229 A | 9/1995 | Aschenbrenner et al. | |
| 6,366,982 B1 * | 4/2002 | Suzuki ................ | G11B 27/002 |
| | | | 711/114 |

(Continued)

FOREIGN PATENT DOCUMENTS

| | | |
|---|---|---|
| CN | 102192631 A | 9/2011 |
| CN | 102407663 A | 4/2012 |

(Continued)

OTHER PUBLICATIONS

Hanaoka Y. et al., "Technologies for Realizing New ETERNUS LT270 High-End Tape Library System", FUJITSU Sci. Tech. J., 42.1, pp. 24-31, Jan. 2006.

(Continued)

*Primary Examiner* — Brian Miller
(74) *Attorney, Agent, or Firm* — Fox Rothschild LLP

(57) ABSTRACT

A data storage library system and method comprising at least one data storage library, the at least one data storage library comprising one or more library frames associated with the one or more library frames and at least one environmental conditioning unit configured to control one or more environmental conditions within the one or more library frames. At least one component locker is housed in an interior portion of the one or more library frames, and the at least one component locker is configured to retain one or more replacement components for use in the at least one data storage library.

20 Claims, 13 Drawing Sheets

(56) References Cited

U.S. PATENT DOCUMENTS

| | | | |
|---|---|---|---|
| 6,467,285 B2* | 10/2002 | Felder | F25D 25/00 62/177 |
| 6,478,524 B1 | 11/2002 | Malin | |
| 6,537,013 B2 | 3/2003 | Emberty et al. | |
| 6,563,771 B1* | 5/2003 | Debiez | G11B 17/24 369/30.79 |
| 6,661,596 B2 | 12/2003 | Chliwnyj et al. | |
| 6,676,026 B1* | 1/2004 | McKinley | G11B 15/6835 165/80.3 |
| 6,854,275 B2 | 2/2005 | Evans | |
| 6,896,612 B1 | 5/2005 | Novotny | |
| 6,924,981 B2 | 8/2005 | Chu et al. | |
| 7,106,538 B2* | 9/2006 | Minemura | G11B 15/68 360/71 |
| 7,277,247 B2* | 10/2007 | Hoshino | G11B 17/225 360/69 |
| 7,434,412 B1 | 10/2008 | Miyahira | |
| 7,474,497 B2* | 1/2009 | Jesionowski | G11B 15/6835 360/92.1 |
| 7,635,246 B2* | 12/2009 | Neeper | G01N 35/00732 414/280 |
| 7,656,602 B2 | 2/2010 | Iben et al. | |
| 7,656,660 B2 | 2/2010 | Hoeft et al. | |
| 7,746,634 B2 | 6/2010 | Hom et al. | |
| 7,751,188 B1 | 7/2010 | French et al. | |
| 7,961,419 B2* | 6/2011 | Suzuki | G06F 1/184 360/69 |
| 8,051,671 B2 | 11/2011 | Vinson et al. | |
| 8,151,046 B2* | 4/2012 | Suzuki | G06F 3/0607 710/22 |
| 8,206,976 B2 | 6/2012 | Kobayashi et al. | |
| 8,210,914 B2 | 7/2012 | McMahan et al. | |
| 8,514,513 B2 | 8/2013 | Hori | |
| 8,544,289 B2 | 10/2013 | Johnson et al. | |
| 8,675,303 B2 | 3/2014 | Compton et al. | |
| 8,694,152 B2 | 4/2014 | Cyrulik et al. | |
| 8,789,384 B2 | 7/2014 | Eckberg et al. | |
| 8,849,784 B2 | 9/2014 | Alber et al. | |
| 8,857,208 B2 | 10/2014 | Malin | |
| 8,939,524 B2 | 1/2015 | Gasser | |
| 8,974,274 B2 | 3/2015 | Carlson | |
| 9,025,275 B1 | 5/2015 | Manes et al. | |
| 9,069,534 B2 | 6/2015 | Rogers | |
| 9,110,641 B2 | 8/2015 | Wu | |
| 9,155,230 B2 | 10/2015 | Eriksen | |
| 9,190,112 B1 | 11/2015 | Bayang et al. | |
| 9,240,209 B1 | 1/2016 | Crawford et al. | |
| 9,255,936 B2* | 2/2016 | Hunt | A01N 1/0236 |
| 9,291,408 B2 | 3/2016 | Iyengar et al. | |
| 9,321,136 B2 | 4/2016 | Eckberg et al. | |
| 9,361,921 B2 | 6/2016 | Herget | |
| 9,368,148 B2 | 6/2016 | Starr et al. | |
| 9,433,122 B2 | 8/2016 | Ohba et al. | |
| 2002/0098064 A1* | 7/2002 | Ostwald | G11B 15/6825 414/277 |
| 2003/0039056 A1 | 2/2003 | Satoh | |
| 2003/0197619 A1 | 10/2003 | Lawrence et al. | |
| 2004/0145468 A1 | 7/2004 | La et al. | |
| 2004/0153386 A1 | 8/2004 | Eckerdt | |
| 2004/0165358 A1 | 8/2004 | Regimbal et al. | |
| 2005/0185323 A1 | 8/2005 | Brace et al. | |
| 2005/0270727 A1 | 12/2005 | Shih | |
| 2006/0177922 A1* | 8/2006 | Shamah | B01L 9/523 435/286.2 |
| 2006/0250578 A1 | 11/2006 | Pohl et al. | |
| 2007/0250410 A1 | 10/2007 | Brignone et al. | |
| 2008/0151491 A1 | 6/2008 | Baldwin et al. | |
| 2009/0046427 A1 | 2/2009 | Noteboom et al. | |
| 2009/0266511 A1 | 10/2009 | Yang | |
| 2010/0188810 A1 | 7/2010 | Andersen et al. | |
| 2010/0254241 A1 | 10/2010 | Aoki | |
| 2011/0108207 A1 | 5/2011 | Mainers et al. | |
| 2011/0231007 A1 | 9/2011 | Biehle et al. | |
| 2013/0031928 A1 | 2/2013 | Kim | |
| 2013/0088833 A1 | 4/2013 | Cox et al. | |
| 2013/0128455 A1 | 5/2013 | Koblenz et al. | |
| 2014/0059946 A1 | 3/2014 | Gardner et al. | |
| 2014/0206271 A1 | 7/2014 | Ignacio | |
| 2014/0238639 A1 | 8/2014 | Ambriz et al. | |
| 2014/0277765 A1 | 9/2014 | Karimi et al. | |
| 2014/0293471 A1 | 10/2014 | Sakuma | |
| 2015/0036293 A1 | 2/2015 | Martini | |
| 2015/0088319 A1 | 3/2015 | Dasari et al. | |
| 2015/0167996 A1 | 6/2015 | Fadell et al. | |
| 2015/0179210 A1 | 6/2015 | Ostwald et al. | |
| 2015/0203297 A1 | 7/2015 | Manning et al. | |
| 2016/0094898 A1 | 3/2016 | Primm et al. | |
| 2016/0107312 A1 | 4/2016 | Morrill et al. | |
| 2016/0112245 A1 | 4/2016 | Mankovskii | |
| 2016/0117126 A1 | 4/2016 | De Spiegeleer et al. | |
| 2016/0240061 A1 | 8/2016 | Li et al. | |
| 2017/0154483 A1 | 6/2017 | Cordiner et al. | |

FOREIGN PATENT DOCUMENTS

| | | |
|---|---|---|
| CN | 102881313 A | 1/2013 |
| CN | 204361533 U | 5/2015 |
| JP | 2009087518 A | 4/2009 |
| JP | 2011191207 A | 9/2011 |
| JP | 2011191207 A | 9/2011 |
| WO | 2007099542 A2 | 9/2007 |
| WO | 2008014578 A1 | 2/2008 |
| WO | 2009134610 A2 | 11/2009 |

OTHER PUBLICATIONS

McCormick-Goodhart M. et al, "The Design and Operation of a Passive Humidity-Controlled Cold Storage Vault Using Conventional Freezer Technology and Moisture-Sealed Cabinets", IS&T's 2004 Archiving Conference, Apr. 20-23, 2005, San Antonio, Texas.

Frachtenberg E. et al., "Thermal Design in the Open Compute Datacenter", Thermal and Thermomechanical Phenomena in Electronic Systems (ITherm), 13th IEEE 122012.

Oga, S. et al., Indirect External Air Cooling Type Energy-Saving Hybrid Air Conditioner for Data Centers, "F-Cool Neo", Fuji Electric Review, vol. 60, No. 1, Mar. 30, 2014, pp. 59-64.

Lee, S. et al., "Thermoelectric-based Sustainable Self-Cooling for Fine-Grained Processor Hot Spots", 15th IEEE ITHERM Conference, May 31-Jun. 3, 2016, pp. 847-856.

Disclosed Anonymously, IP.COM, "Method for a Direct Air Free Cooling with a real time hygrometry regulation for Data Center", IPCOM000200312D, Oct. 5, 2010, pp. 1-3.

Rasmussen N., "Cooling Options for Rack Equipment with Side-to-Side Airflow", www.apc.com, 2004.

Ouchi M. et al., "Thermal Management Systems for Data Centers with Liquid Cooling Technique of CPU", ITherm IEEE 13th Intersociety Conference, May 30-Jun. 1, 2012, pp. 790-798.

Authors: IBM, "Energy Efficient Cooling System for Data Center", IPCOM000182040D, Apr. 23, 2009, pp 1-4.

Ernest S. Gale et al., U.S. Appl. No. 15/460,389, filed Mar. 16, 2017.
Ernest S. Gale et al., U.S. Appl. No. 15/460,397, filed Mar. 16, 2017.
Ernest S. Gale et al., U.S. Appl. No. 15/460,403, filed Mar. 16, 2017.
Ernest S. Gale et al., U.S. Appl. No. 15/460,420, filed Mar. 16, 2017.
Jose G. Miranda Gavillan et al., U.S. Appl. No. 15/460,345, filed Mar. 16, 2017.
Jose G. Miranda Gavillan et al., U.S. Appl. No. 15/460,357, filed Mar. 16, 2017.
Jose G. Miranda Gavillan et al., U.S. Appl. No. 15/460,379, filed Mar. 16, 2017.
Jose G. Miranda Gavillan et al., U.S. Appl. No. 15/460,402, filed Mar. 16, 2017.
Jose G. Miranda Gavillan et al., U.S. Appl. No. 15/460,423, filed Mar. 16, 2017.
Jose G. Miranda Gavillan et al., U.S. Appl. No. 15/460,441, filed Mar. 16, 2017.
Jose G. Miranda Gavillan et al., U.S. Appl. No. 15/460,456, filed Mar. 16, 2017.

(56) References Cited

OTHER PUBLICATIONS

Jose G. Miranda Gavillan et al., U.S. Appl. No. 15/460,472, filed Mar. 16, 2017.
Jose G. Miranda Gavillan et al., U.S. Appl. No. 15/460,479, filed Mar. 16, 2017.
Jose G. Miranda Gavillan et al., U.S. Appl. No. 15/460,429, filed Mar. 16, 2017.
Jose G. Miranda Gavillan et al., U.S. Appl. No. 15/460,439, filed Mar. 16, 2017.
Ernest S. Gale et al., U.S. Appl. No. 15/460,497, filed Mar. 16, 2017.

* cited by examiner

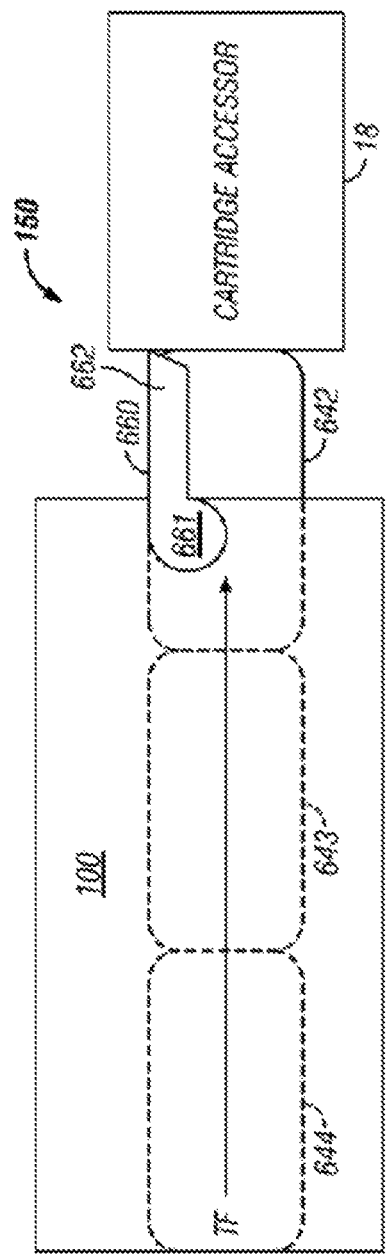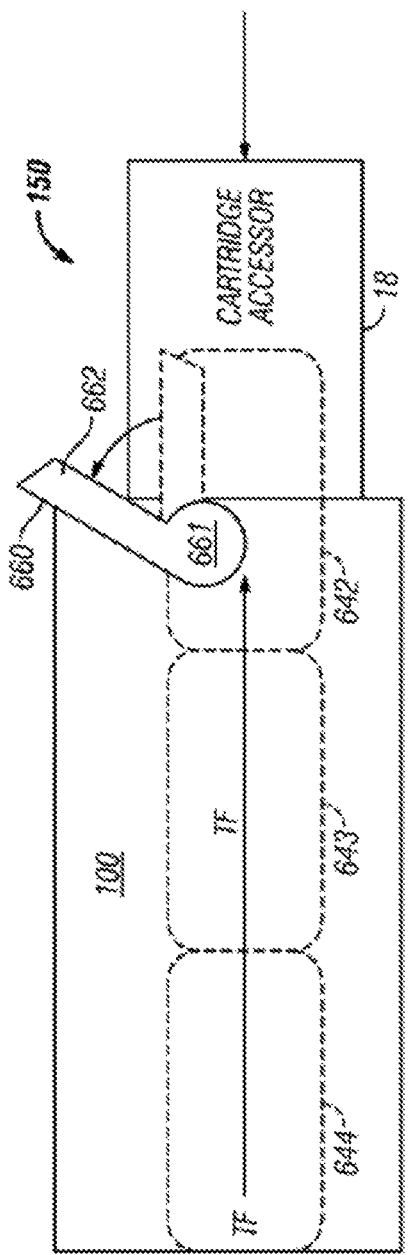

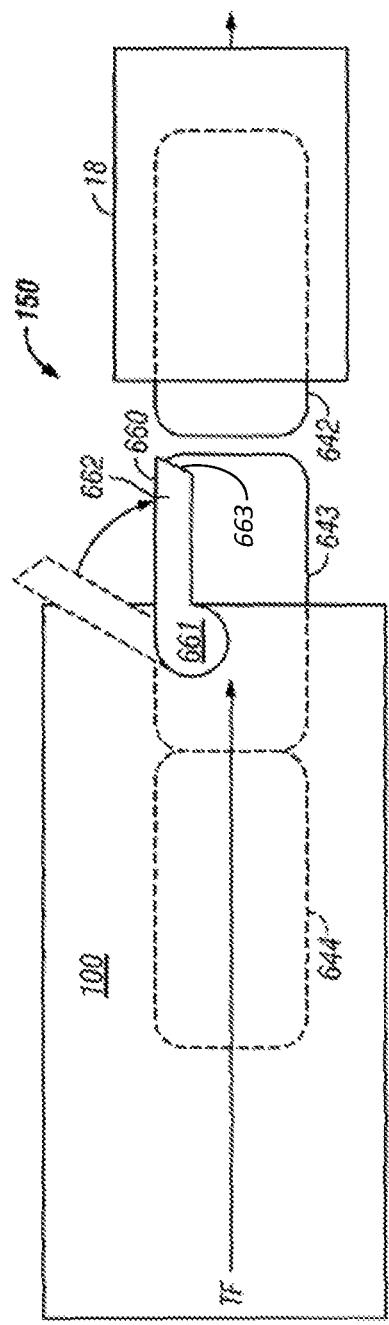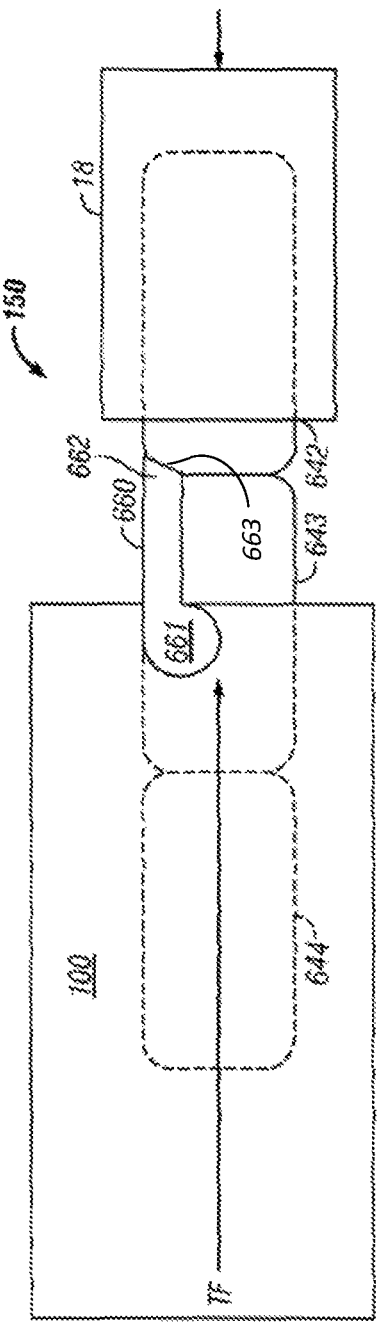

DATA STORAGE LIBRARY WITH COMPONENT LOCKER FOR ENVIRONMENTAL ACCLIMATION

BACKGROUND

The present disclosure relates to a data storage library for the storage and transfer of data, and more specifically, to a data storage library having one or more library frames comprising a component locker or storage chamber located in an unused portion of the one or more library frames. The component locker(s) provide environmental acclimation of one or more components prior to installation.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as PROM, EEPROM, flash PROM, COMPACTFLASH™, SMARTMEDIA™, MEMORY STICK™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more robotic accessors. Such accessors have grippers for physically retrieving the selected data storage cartridges from the storage slots within the automated data storage library and transporting such cartridges to the data storage drives by moving, for example, in the horizontal (X) and vertical (Y) directions.

SUMMARY

In accordance with an aspect of the disclosure, a data storage library system is disclosed, the system comprising at least one data storage library, the at least one data storage library comprising at least one library frame, wherein at least one environmental conditioning unit is associated with the at least one frame. The at least one environmental conditioning unit is configured to control at least one environmental condition within the at least one library frame. The system further comprises at least one component locker housed in an interior portion of the at least one library frame, wherein the at least one component locker is configured to retain at least one replacement component for use in the at least one data storage library.

According to another aspect of the disclosure, a system is disclosed, the system including a data storage library, the data storage library comprising at least one library frame and at least one environmental conditioning unit, the at least one environmental conditioning unit configured to control at least one environmental condition within the data storage library. The system also includes a front access door configured to allow access into a front interior portion of the at least one library frame, as well as a rear access door configured to allow access into a rear interior portion of at least one library frame. At least one component locker is housed in the rear interior portion of the at least one library frame, wherein the at least one component locker is configured to retain at least one replacement component for use in the data storage library.

In accordance with another aspect of the disclosure, a method of acclimating one or more replacement components within a data storage library is disclosed. The method comprises providing a data storage library having one or more library frames, providing an environmental conditioning unit configured to control an environmental condition within the one or more library frames, and providing at least one component locker within a portion of the one or more library frames, the at least one component locker configured for storage of at least one replacement component for one or more library frames. The method also includes providing one or more replacement components, detecting at an environmental condition within the one or more library frames and an ambient environmental condition outside of the one or more library frames, adjusting the environmental condition within the one or more library frames such that the environmental condition within the one or more library frames is within a desired range of the ambient environmental condition. The method further comprises inserting the one or more replacement components within the at least one component locker, and incrementally adjusting the environmental condition within the one or more library frames such that the environmental condition within the one or more library frames reaches a predetermined operational condition.

BRIEF DESCRIPTION OF THE DRAWINGS

FIGS. 8A-8D are partial side views of one embodiment of a cartridge blocking mechanism.

DETAILED DESCRIPTION

Figure 1A:
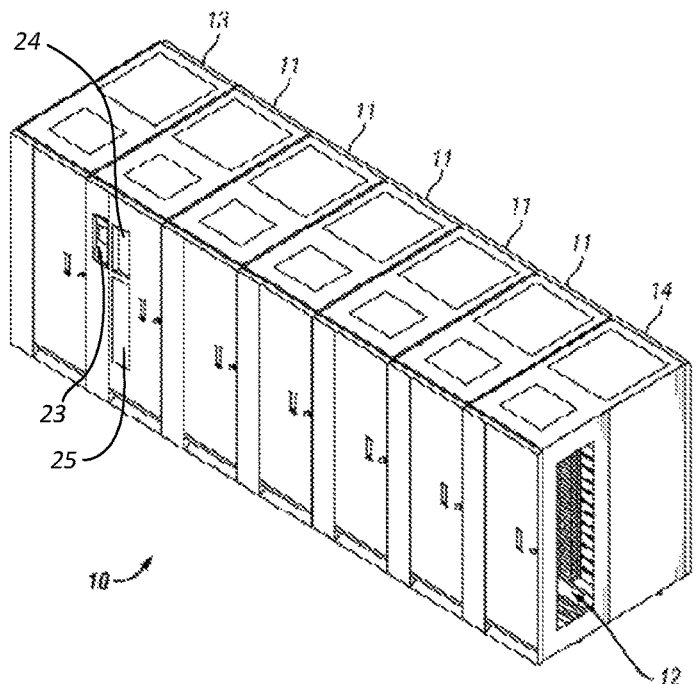
FIG. 1A is a perspective view of one embodiment of an automated data storage library.

The following description is made for the purpose of illustrating the general principles of the present disclosure and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In an effort to increase storage capacity, deep slot technology allows for storage cells that contain more than a single data storage cartridge. Such storage libraries allow for higher density, or more cartridges stored per square foot. In "deep slot" libraries, two or more cartridges may be stored in a multi-cartridge deep slot cell, arrayed in series, one behind the other, in tiers ranging from a front-most tier to a rearmost tier.

Efforts to improve the performance of traditional data centers attempt to minimize the cost of processing and storing data. One option that is employed to reduce operational costs of datacenters is to run the equipment in the datacenter at the high end of its environmental operational limits, thereby allowing for cooling of the datacenter to be reduced. In other words, datacenters are running increasingly hot and more humid conditions than traditional datacenters in an attempt to reduce operating costs. Although this strategy may be effective when applied to disk and/or flash data storage environments, magnetic tape is more susceptible to degradation when exposed to these unfavorable conditions. Therefore, this option is not available for magnetic data storage libraries.

In an effort to control the environment within magnetic data storage libraries so as to provide suitable working conditions for magnetic tape media, data storage drives, etc., air conditioning units may be incorporated into the data storage libraries themselves. While these air conditioning units effectively control the temperature and humidity within the data storage libraries, the environmental conditions of the area surrounding the data storage libraries remain largely unchanged, with conditions often being higher in both temperature and humidity. While this may allow a datacenter to operate at reduced costs, it may also result in a marked temperature differential between the interior and exterior environments of the data storage libraries. Such a temperature differential may prove problematic during service of the data storage library and/or replacement of data storage library components such as data storage cartridges, data storage drives, etc., as condensation may develop on replacement cartridges and other service parts during installation and/or removal from the data storage library. Condensation accumulation on such sensitive componentry may cause component failure and/or data loss.

Figure 1B:
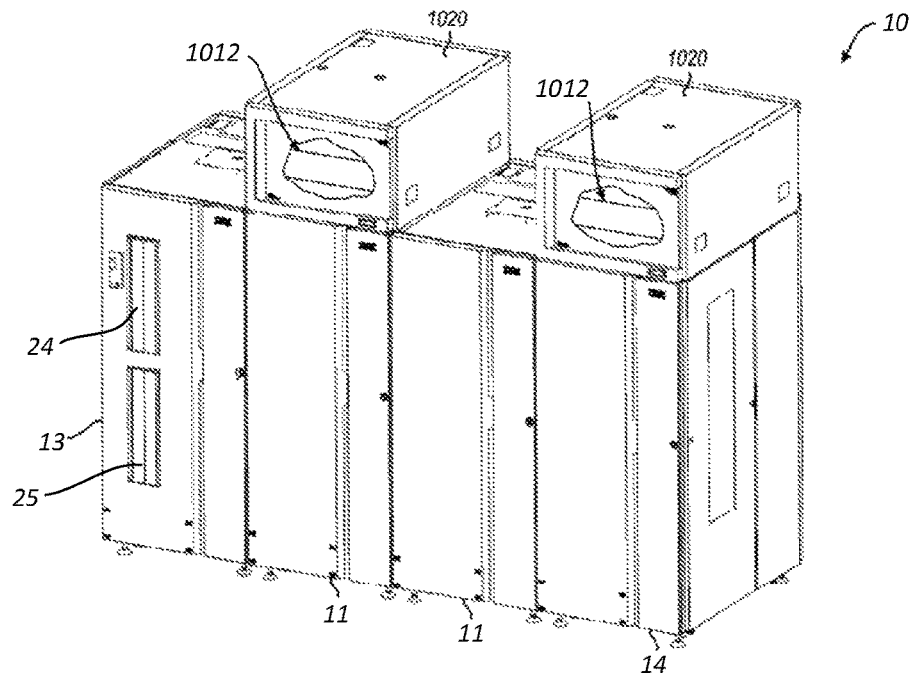
FIG. 1B is a perspective view of another embodiment of an automated data storage library.
Figure 2:
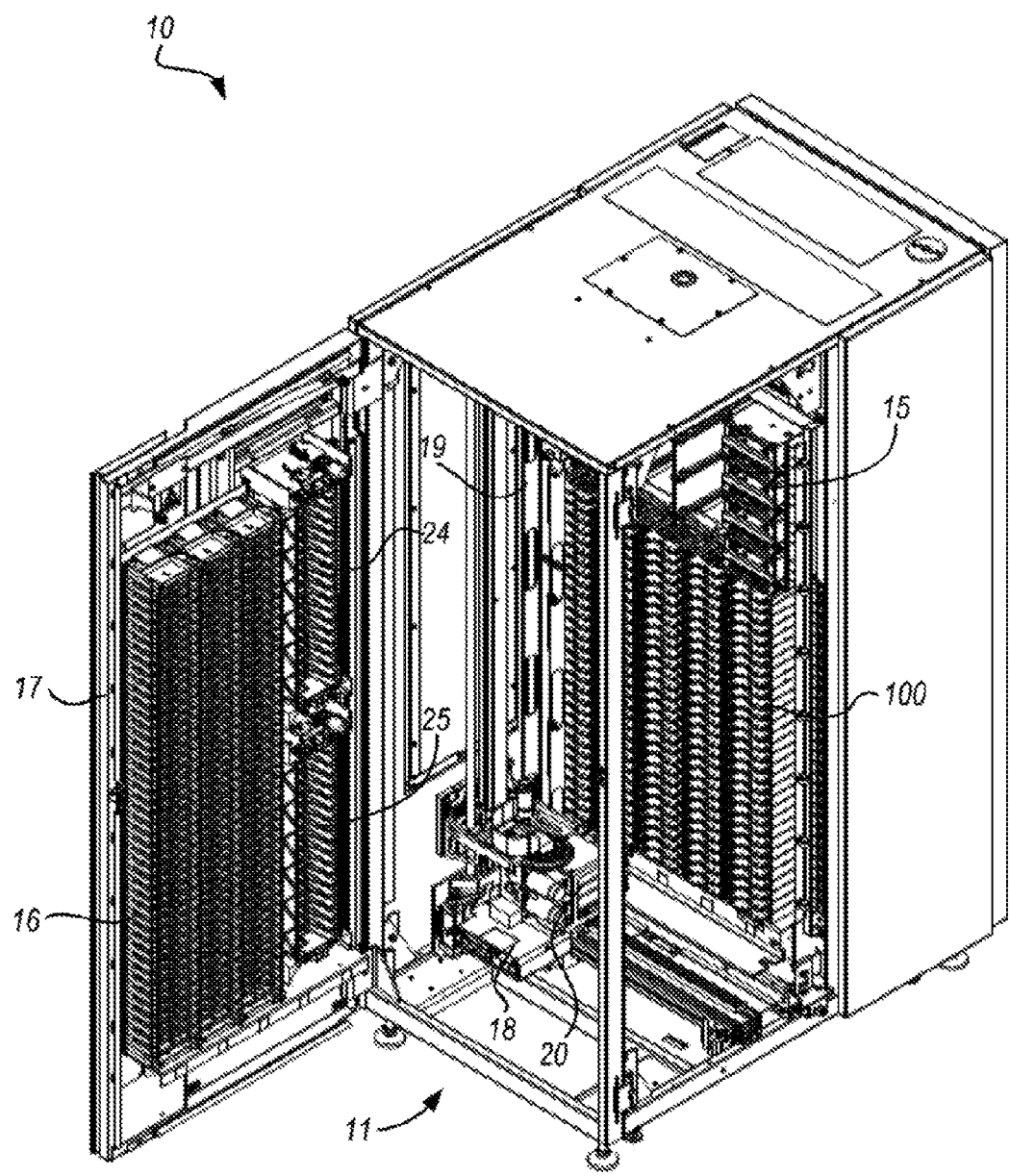
FIG. 2 is a perspective view of a storage frame from the data storage library of FIG. 1.

FIGS. 1A & 1B and FIG. 2 illustrate an automated data storage library 10 which stores and retrieves data storage cartridges, containing data storage media (not shown), from multi-cartridge deep slot storage cells 100 and single cartridge storage slots 16. An example of an automated data storage library which has a similar configuration as that depicted in FIG. 1A and FIG. 2, and may be implemented with some of the various approaches herein is the IBM 3584 UltraScalable Tape Library.

The library 10 of FIG. 1A comprises a left hand service bay 13, one or more storage frames 11, and right hand service bay 14. The library 10 of FIG. 1B comprises a left handed service bay 13, one or more storage frames 11, a right handed service bay 14 and optional environmental conditioning units 1012 which may control the temperature, humidity and/or other environmental conditions in the interior of the library 10. While two environmental conditioning units are shown in FIG. 1B, it will be appreciated that more or less environmental conditioning units 1012, may be associated with the library, and in circumstances the library may have no environmental conditioning units. As will be discussed in further detail below, a frame may comprise an expansion component of the library. Thus, storage frames may be added or removed to expand or reduce the size and/or functionality of the library. According to different approaches, frames may include additional storage slots, deep storage slot cells, drives, import/export stations, accessors, operator panels, etc. Moreover, an accessor aisle 12 preferably extends between the storage frames and bays of the embodiments in FIGS. 1A & 1B thereby allowing an accessor to move between frames.

FIG. 2 shows an exemplary embodiment of a storage frame 11, which may act as the base frame of the library 10. The storage frame 11 illustrated in FIG. 2 may have only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front wall 17 and a plurality of multi-cartridge deep slot cells 100 on rear wall 19, both of which may be used for storing data storage cartridges that may contain data storage media. According to one approach, the storage slots 16 are configured to store a single data storage cartridge, and the multi-cartridge deep slot cells 100 are configured to store a plurality of data storage cartridges. In a preferred approach, the interior of the multi-cartridge deep slot cells may be arranged so that the plurality of the data storage cartridges are in sequential order of tiers from front to rear (e.g., see FIG. 7A).

With continued reference to FIG. 2, the storage frame 11 of the library 10 also includes at least one data storage drive 15, e.g., for reading and/or writing data with respect to the data storage media in the data storage cartridges. Additionally, a first accessor 18 may be used to transport data storage cartridges containing data storage media between the plurality of storage slots 16, the multi-cartridge deep slot cells 100, and/or the data storage drive(s) 15. According to various approaches, the data storage drives 15 may be optical disk drives, magnetic tape drives, or other types of data storage drives that are used to read and/or write data with respect to the data storage media.

As illustrated, the storage frame 11 may optionally include an operator panel or other user interface, such as a web-based interface, which allows a user to interact with the library 10. The storage frame 11 may also optionally comprise an upper import/export (I/O) station 24 and/or a lower I/O station 25, thereby allowing data storage cartridges to be added (e.g., inserted) to the library inventory and/or removed from the library without having to open front door 17 or otherwise disrupt library operations. Furthermore, the library 10 may have one or more storage frames 11, each having storage slots 16, preferably accessible by the first accessor 18.

As described above, the storage frames 11 may be configured with different components depending upon the intended function. One configuration of storage frame 11 may comprise storage slots 16 and/or multi-cartridge deep slot cells 100, data readers or drive(s) 15, and or accessors 18, and other optional components to store and retrieve data from the data storage cartridges. However, in another approach, a storage frame 11 may include storage slots 16 and/or multi-cartridge deep slot cells 100 and no other components. The first accessor 18 may have a gripper assembly 20, e.g., for gripping one or more data storage cartridges, in addition to having a bar code scanner or other reading system, such as a cartridge memory reader or similar system mounted on the gripper assembly 20, to "read" identifying information about the data storage cartridge.

The service bays may be configured with different components and in different configurations depending upon its intended function. The service bay is typically another frame of the library 10 and without intent on limiting the disclosure generally provides an area to house and perform service on the robotic accessor without interfering with the operation of the other library frames. The service bay may include a moveable panel or door to provide access to its interior, and may further include one or more data cartridge storage slots, multi-cartridge deep slot storage cells, data cartridges, accessors, data readers, as well as other components.

Figure 3:
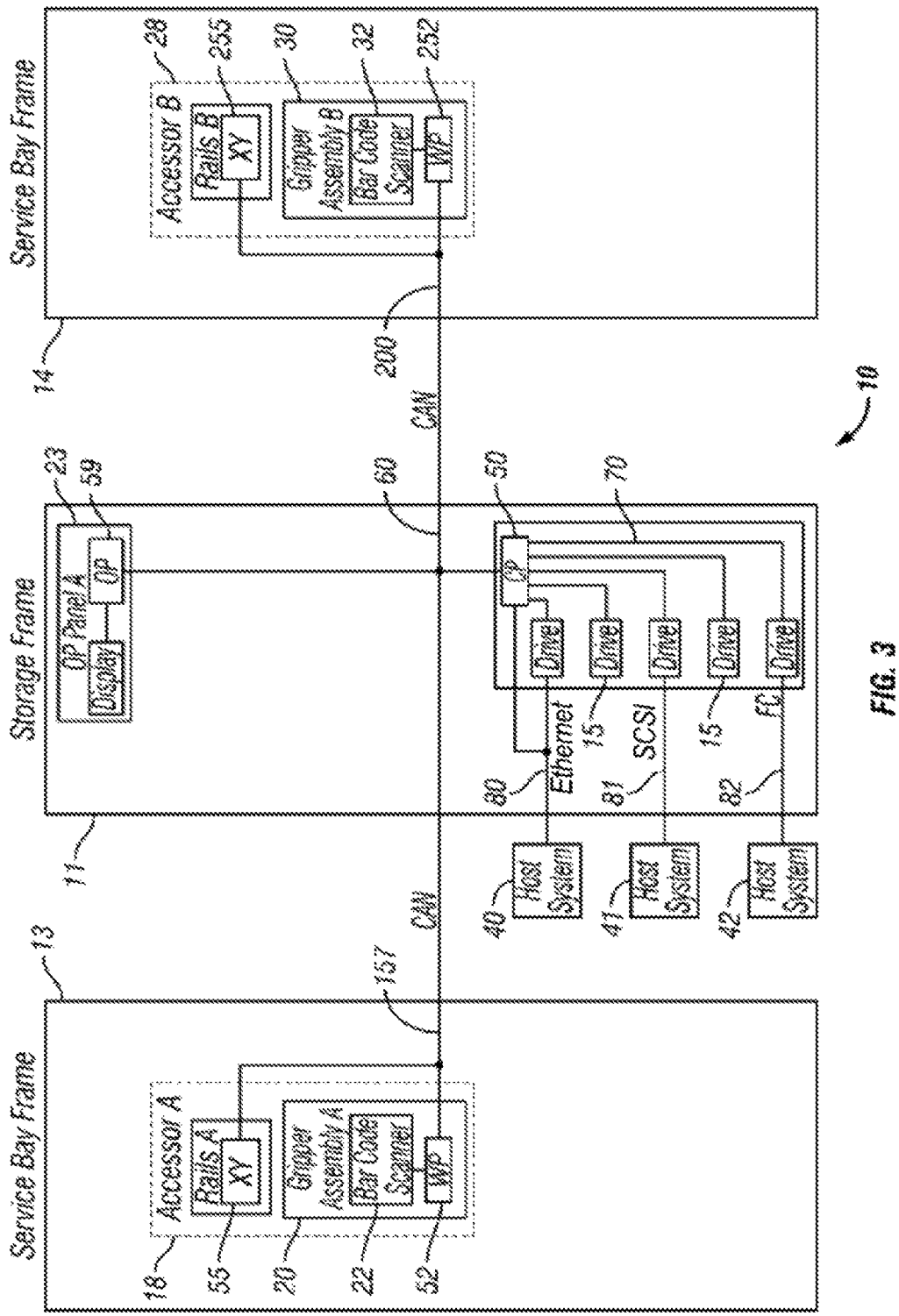
FIG. 3 is a schematic diagram of one embodiment of an automated data storage library.

FIG. 3 depicts and schematically illustrates an automated data storage library 10, in accordance with one embodiment. As an option, the automated data storage library 10 may be implemented in conjunction with features from any other embodiment listed herein, such as those described with reference to the other FIGS. Of course, however, such automated data storage library 10 and others presented herein may be used in various applications and/or in permutations which may or may not be specifically described in the illustrative embodiments listed herein. Further, the automated data storage library 10 presented herein may be used in any desired environment. Thus FIG. 3 (and the other FIGS.) should be deemed to include any and all possible permutations.

Referring now to FIG. 3, the automated data storage library 10 as described in reference to FIGS. 1A & 1B and FIG. 2, is depicted according to one embodiment. According to a preferred approach, the library 10 may employ a controller, e.g., arranged as a distributed system of modules with a plurality of processor nodes.

In one approach, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements of the accessor, gripper, controllers, and other components, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

Referring still to FIG. 3, the library 10 may have one or more storage frames 11, a left hand service bay 13 and a right hand service bay 14. The left hand service bay 13 is shown with a first accessor 18, where, as discussed above, the first accessor 18 may include a gripper assembly 20 and/or a bar code scanner (e.g., reading system) to "read" identifying information about the data storage cartridges depending on the desired embodiment. Furthermore, the right hand service bay 14 is shown having a second accessor 28, which includes a gripper assembly 30 and may also include a reading system 32 to "read" identifying information about the data storage cartridges.

According to one approach, in the event of a failure or other unavailability of the first accessor 18, or its gripper assembly 20, etc., the second accessor 28 may perform some or all of the functions of the first accessor 18. Thus in different approaches, the two accessors 18, 28 may share one or more mechanical paths, they may have completely independent mechanical paths, or combinations thereof. In one example, the accessors 18, 28 may have a common horizontal rail with independent vertical rails to travel therealong. Moreover, it should be noted that the first and second accessors 18, 28 are described as first and second for descriptive purposes only and this description is not meant to limit either accessor to an association with either the left hand service bay 13, or the right hand service bay 14.

In an exemplary embodiment which is in no way intended to limit the disclosure or the invention, the first and second accessors 18, 28 may preferably move their grippers in at least two directions, called the horizontal "X" direction and vertical "Y" direction, e.g., to retrieve and grip, deliver and release, load and unload, etc. the data storage cartridges at the storage slots 16, multi-cartridge deep slot cells 100, data storage drives 15, etc.

With continued reference to FIG. 3, library 10 receives commands from one or more host systems 40, 41, 42. The host systems 40, 41, 42, such as host servers, communicate with the library directly, e.g., on line 80 (e.g., path), through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16, the deep slot cells 100, and the data storage drives 15. The commands are typically logical commands identifying the data storage cartridges or data storage cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessors 18, 28 and/or gripper assemblies 20, 30. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

Still referring to FIG. 3, the communication processor node 50 may additionally provide a line 70 for communicating with the data storage drives 15, e.g., a communication link. As illustrated, the communication processor node 50 may preferably be located in the storage frame 11, e.g., close to the data storage drives 15. Furthermore, one or more additional work processor nodes may be provided to form an exemplary distributed processor system, which may comprise, e.g., a work processor node 52 located at first accessor 18, and that is coupled to the communication processor node 50 via a network 60, 157. According to different approaches, each work processor node may respond to received commands that are broadcast thereto from any communication processor node, and the work processor nodes may also direct the operation of the accessors, e.g., providing move commands. An XY processor node 55 may be provided and may be located at an XY system of first accessor 18. As illustrated, the XY processor node 55 is coupled to the network 60, 157, and is responsive to the move commands, operating the XY system to position the gripper assembly 20.

Also, an operator panel processor node 59 may be provided at the optional operator panel 23 for providing an interface for communicating between the operator panel and the communication processor node 50, the work processor nodes 52, 252, and the XY processor nodes 55, 255.

A network 60, for example comprising a common bus, is provided, coupling the various processor nodes. The network may comprise a robust wiring network, such as the commercially available Controller Area Network (CAN) bus system, which is a multi-drop network, having a standard access protocol and wiring standards, for example, as defined by CiA, the CAN in Automation Association, Am Weich Selgarten 26, D-91058 Erlangen, Germany. Other networks, such as Ethernet, or a wireless network system, such as RF or infrared, may be employed in the library as is known to those of skill in the art. In addition, multiple independent networks may also be used to couple the various processor nodes.

As illustrated in FIG. 3, the communication processor node 50 is coupled to each of the data storage drives 15 of a storage frame 11, via lines 70, and may communicate with the drives 15 and with host systems 40, 41, 42. Alternatively, the host systems 40, 41, 42 may be directly coupled to the communication processor node 50, at line 80 (e.g., input) for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 3, lines 80 and 81 are intended to be Ethernet and a SCSI bus, respectively, e.g., and may serve as host connections. However, path 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as Ethernet, or a serial connection, such as RS-422. Thus, the data storage drives 15 may be individually coupled to the communication processor node 50 by lines 70. Alternatively, the data storage drives 15 may be coupled to the communication processor node 50 through one or more networks.

Furthermore, additional storage frames 11 may be provided, whereby each is preferably coupled to the adjacent storage frame. According to various approaches, any of the additional storage frames 11 may include communication processor nodes 50, storage slots 16, storage cells 100, data storage drives 15, networks 60, etc.

Moreover, as described above, the automated data storage library 10 may comprise a plurality of accessors. For example, in addition to first accessors 18 in service bay frame 13, a second accessor 28, for example, is shown in a right hand service bay 14 of FIG. 3. The second accessor 28 may include a gripper assembly 30 for accessing the data storage media, and an XY system 255 for moving the second accessor 28. The second accessor 28 may run on the same horizontal mechanical path as the first accessor 18, and/or on an adjacent (e.g., separate) path. Moreover, the illustrative control system additionally includes an extension network 200 which forms a network coupled to network 60 of the storage frame(s) 11 and to network 157 of left hand service bay 13.

In FIG. 3 and the accompanying description, the first and second accessors are associated with the left hand service bay 13 and the right hand service bay 14 respectively. However, this is for illustrative purposes and there may not be an actual association. Thus, according to another approach, network 157 may not be associated with the left hand service bay 13 and network 200 may not be associated with the right hand service bay 14. Moreover, depending on the design of the library, it may not be necessary to have a left hand service bay 13 and/or a right hand service bay 14 at all.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 4:
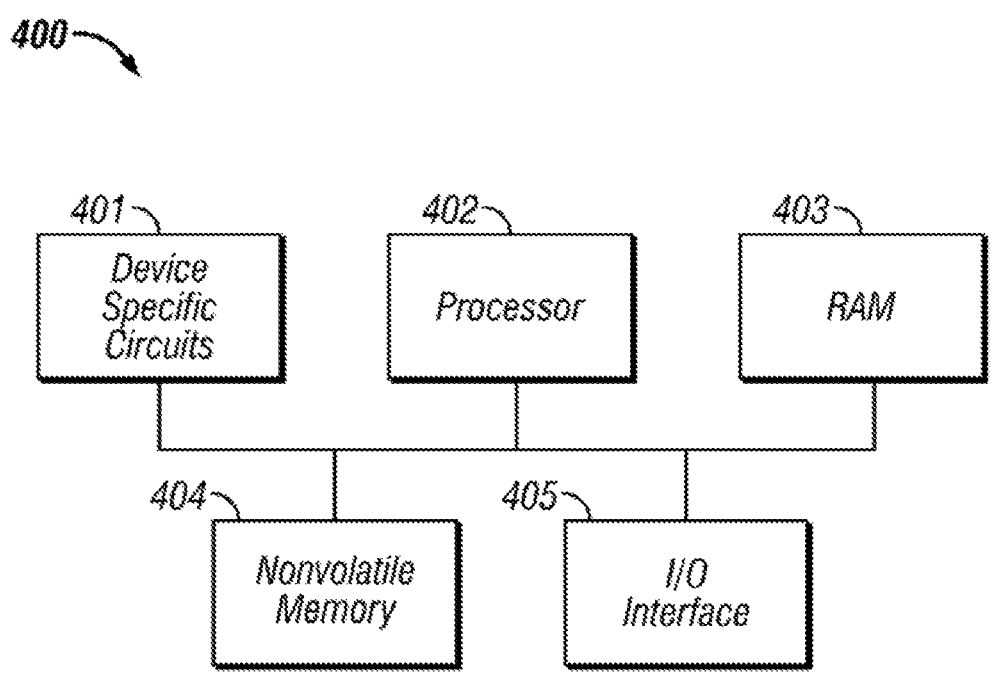
FIG. 4 is a block diagram depicting a controller configuration according to one embodiment.

Referring now to FIG. 4, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data. Moreover, the I/O interface 405 comprises a communication interface that allows the processor 402 to communicate with devices external to the controller. Examples may comprise, but are not limited to, serial interfaces such as RS-232, USB (Universal Serial Bus) or Small Computer Systems Interface (SCSI). The device specific circuits 401 provide additional hardware to enable the controller 400 to perform unique functions including, but not limited to, motor control of an accessor cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 3) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers.

Figure 5A:
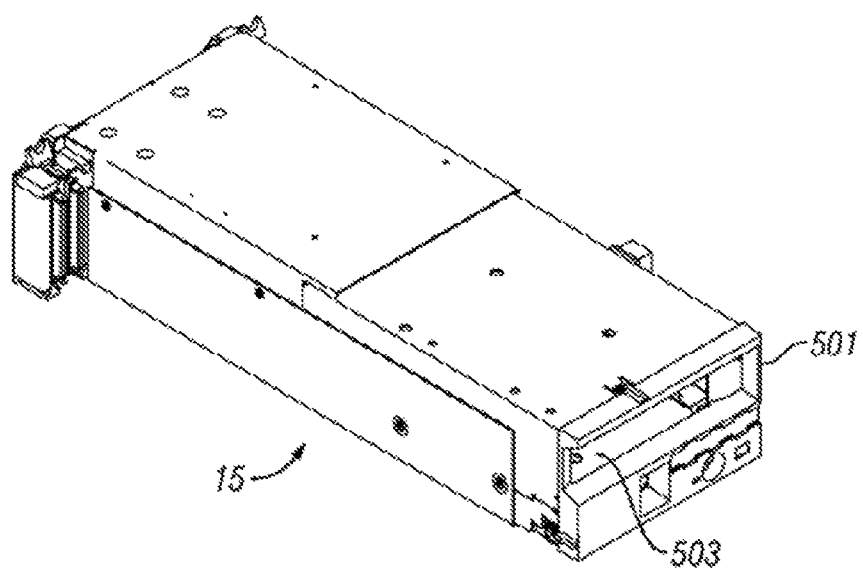
FIG. 5A is a front perspective view of one embodiment of a data storage drive.
Figure 5B:
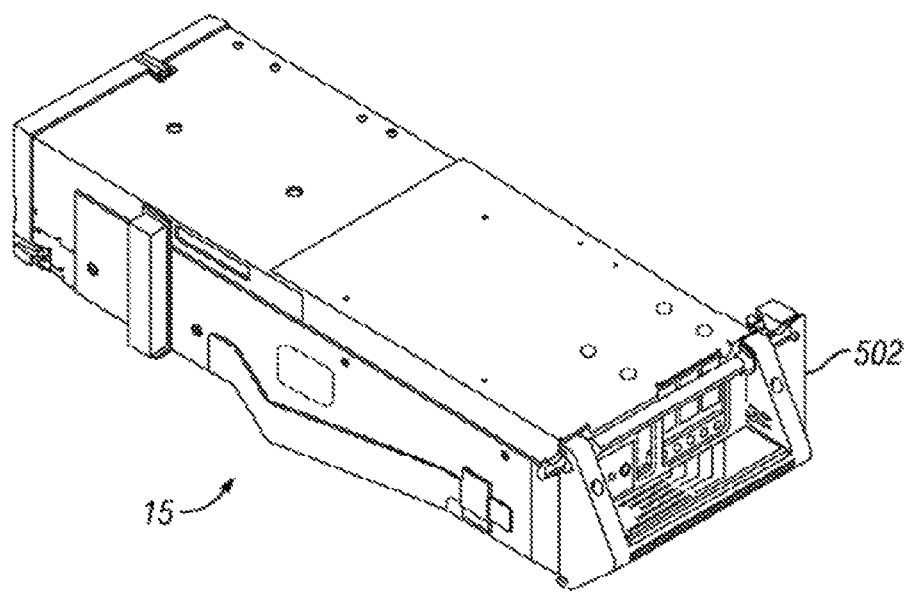
FIG. 5B is a rear perspective view of the data storage drive of FIG. 5A.

FIGS. 5A-5B illustrate the front 501 and rear 502 views of a data storage drive 15, according to one embodiment. In the example depicted in FIGS. 5A-5B, the data storage drive 15 comprises a hot-swap drive canister, which is in no way intended to limit the disclosure or the invention. In fact, any configuration of data storage drive may be used whether or not it includes a hot-swap canister. As discussed above, a data storage drive 15 is used to read and/or write data with respect to the data storage media, and may additionally communicate with a memory which is separate from the media, and is located within the cartridge. Thus, according to one approach, a data storage cartridge having data storage media may be placed into the data storage drive 15 at opening 503.

Figure 6:
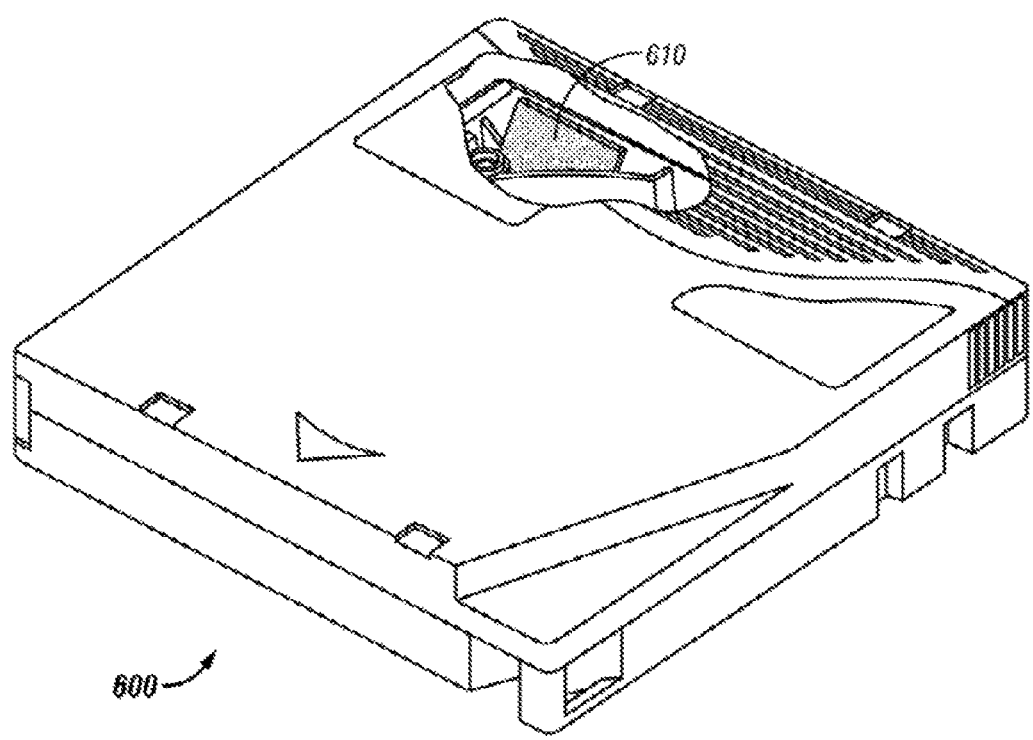
FIG. 6 is perspective view of one embodiment of a data storage cartridge having a cutaway portion.

Furthermore, FIG. 6 illustrates an embodiment of a data storage cartridge 600 with a cartridge memory 610 shown in a cutaway portion of the Figure, which is in no way intended to limit the disclosure or the invention. In fact, any configuration of data storage cartridge may be used whether or not it comprises a cartridge memory. According to various approaches, the media of the data storage cartridge may include any type of media on which data may be stored, including but not limited to magnetic media, e.g., magnetic tape, disks, etc.; optical media, e.g., optical tape, disks, etc.; electronic media, e.g., PROM, EEPROM, flash PROM, COMPACTFLASH™, SMARTMEDIA™, MEMORY STICK™, etc.; etc., or other suitable media. Moreover, an example of a data storage cartridge that is widely employed in automated data storage libraries for mass data storage is a magnetic tape cartridge in which the media is magnetic tape.

Figure 7A:
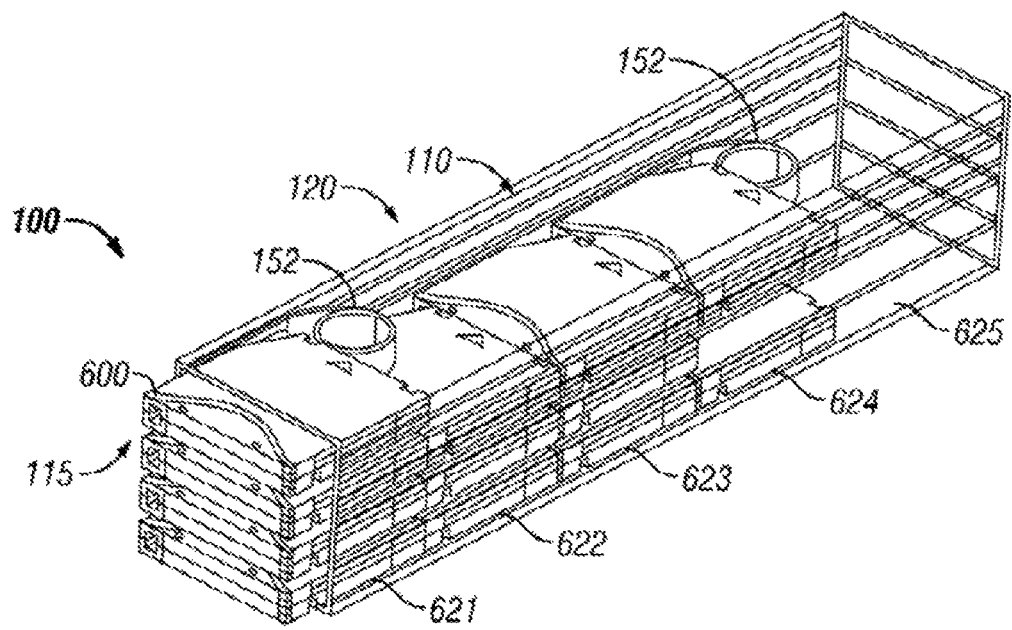
FIGS. 7A-7B are perspective views of one embodiment of a multi-cartridge deep slot cell.
Figure 7B:
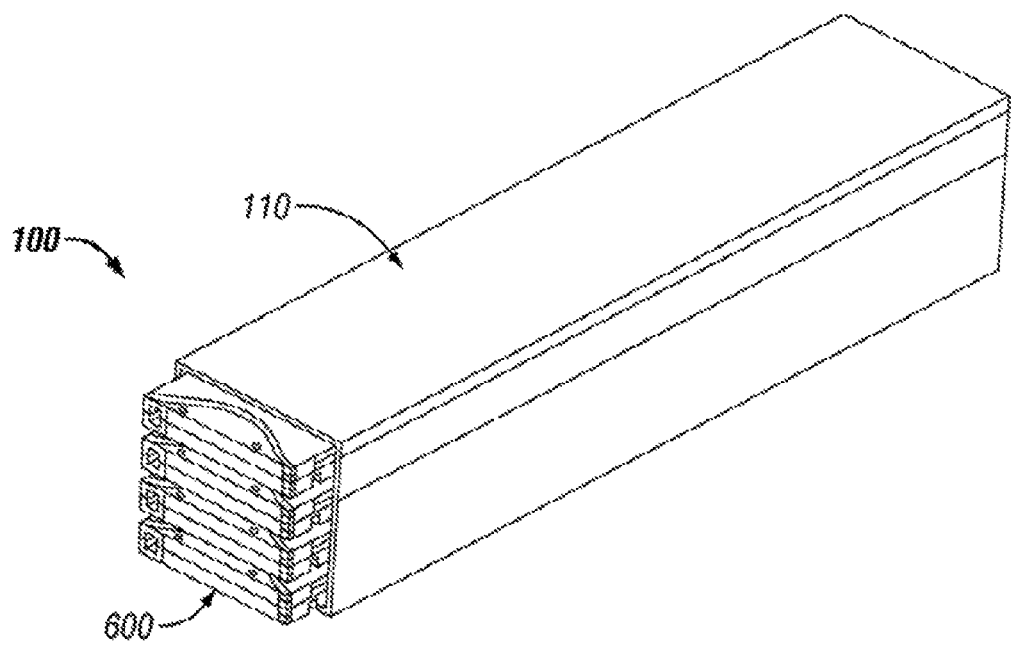

Looking now to FIGS. 7A-7B, a multi-cartridge deep slot cell 100 having biasing springs 152 is depicted according to one embodiment. As shown in the illustrative embodiment, the multi-cartridge deep slot cell 100 comprises a housing 110 defining an interior space 115. A plurality of storage slots 120 is disposed within the housing 110, and may be configured for storing a plurality of data storage cartridges 600, depending on the desired approach. Alternatively, the multi-cartridge deep slot cell 100 may be built into the frame of the automated data storage library according to one approach.

FIGS. 8A-8D illustrate an embodiment of a cartridge blocking mechanism 150 having a retaining gate 660 that retains the data storage cartridges in the multi-cartridge deep slot cell 100 according to one embodiment. As illustrated, according to one approach, the retaining gate 660 may be externally attached to a multi-cartridge deep slot cell 100, relative to a front opening 503 (See FIG. 5A) of the multi-cartridge deep slot cell 100, whereby the retaining gate 660 can be activated by an accessor 18, e.g., of an automated data storage library. Moreover, the retaining gate 660 allows for positive cartridge retention against the pressure of biasing springs (see 152 of FIG. 7A), and ensures that one or more data storage cartridges do not get pushed out of the multi-cartridge deep slot cell 100 simultaneously, while allowing the biasing springs (shown in FIG. 7A) of the multi-cartridge deep slot cell 100 to continuously push data storage cartridge(s) to the opening in a multi-cartridge deep slot cell 100. Thus, according to one approach, the accessor 18 may open the retaining gate 660 to gain access to the data storage cartridge in tier 1 and, upon its extraction, the biasing spring 152 moves the cartridge(s) positioned behind the extracted cartridge forward, thereby promoting the cartridge(s) by one tier as will soon become apparent.

The basic working of the retaining gate is that the gate prevents the data storage cartridge(s) from being pushed out of a multi-cartridge deep slot cell 100. For example, as shown in FIGS. 8A-8D, a retaining gate 660 may be lifted (See FIG. 8B) by, for example, accessor 18 or by a front storage cartridge 642 for cartridge removal from/insertion into a multi-cartridge deep slot cell 100. Specifically, retaining gate 660 has a pivoting arm 661 mounted on multi-cartridge deep slot cell 100 via a pivoting post (not shown) that may be integral to or connected to a multi-cartridge deep slot cell 100. Retaining gate 660 includes a catch 662 whereby a thrust force TF through data storage cartridges 644-642 caused by the pushing mechanism biasing springs 152 (shown in FIG. 7A but not shown in FIG. 8A) of multi-cartridge deep slot cell 100 causes retaining gate 660 to stay closed in a retaining position as shown in FIG. 8A. Moreover, the retaining gate 660 is preferably biased such that it closes in the downward direction over the front opening of multi-cartridge deep slot cell 100. This constant biasing may be achieved via gravity as shown in FIG. 8A or by implementing a spring force, e.g., attached to retaining gate 660 (not shown).

For removal of front storage cartridge 642 by accessor 18 from multi-cartridge deep slot cell 100, retaining gate 660 must be lifted upward to a releasing position whereby catch 662 of retaining gate 660 is disengaged from front storage cartridge 642. This can be seen in FIG. 8B where accessor 18 interfaces with retaining gate 660 by providing a lifting force. Once retaining gate 660 is lifted to the releasing position and accessor 18 is engaged with storage cartridge 642, accessor 18 can pull storage cartridge 642 out of multi-cartridge deep slot cell 100 and into accessor 18 without any interference of retaining gate 660 as shown in FIG. 8C. In view of storage cartridges 644 and 643 being stored in multi-cartridge deep slot cell 100, retaining gate 660 must return to its retaining position to prevent storage cartridges 644 and 643 from being ejected from multi-cartridge deep slot cell 100 by the thrust force TF of the pushing mechanism (not shown in FIG. 8C). During extraction of front storage cartridge 642 through the front opening of multi-cartridge deep slot cell 100, the retaining gate 660, which is biased downward, moves back to the retaining position to engage storage cartridge 643.

Once front storage cartridge 642 is extracted and storage cartridges 643 and 644 are retained from being pushed out of multi-cartridge deep slot cell 100, retaining gate 660 has successfully completed its cartridge retrieval process. In FIG. 8C, retaining gate 660 demonstrates its ability to insert the data storage cartridges into multi-cartridge deep slot cell 100. When accessor 18 begins to insert storage cartridge 642 back into multi-cartridge deep slot cell 100, retaining gate 660 is lifted to its releasing position to allow storage cartridge 642 through the front opening of multi-cartridge deep slot cell 100. Catch 662 of retaining gate 660 interfaces with a rear portion of storage cartridge 642, in particular a beveled surface 663 of catch 662 as shown in FIG. 8D, whereby retaining gate 660 is lifted to its releasing position as shown in FIG. 8B due to storage cartridge 642 being pushed in multi-cartridge deep slot cell 100 by accessor 18. In doing so, storage cartridges 644, 643 are pushed deeper into multi-cartridge deep slot cell 100 by storage cartridge 642 in multi-cartridge deep slot cell 100 by accessor 18. Thus, the accessor is able to provide a force greater than the thrust force TF antiparallel thereto, to overcome the directional biasing of the storage cartridges 644, 643. Upon full insertion of the data storage cartridge into multi-cartridge deep slot cell 100, retaining gate 660 moves to its retaining position to engage storage cartridge 642 as shown in FIG. 8A.

Thus, looking to various embodiments presented herein, access to a storage slot may include the ability to remove a cartridge from a storage slot, the ability to place a cartridge into a storage slot, or combinations thereof.

According to an exemplary embodiment, the storage slots from top to bottom are considered to be in parallel and comprise the same tier. Moreover, the storage slots from front to back, in a particular row, are considered to be in series and comprise sequential tiers.

Referring back to FIGS. 7A-7B, in accordance with one embodiment, storage slots 120 are depicted as being configured for storing a plurality of data storage cartridges 600, and arranged in sequential order of tiers 621, 622, 623, 624, 625 from front to rear. It should be noted that the front-most tier 621 is also called "tier 1", while the next tier 622 is called "tier 2", etc., and the last tier 625 is also called the "rearmost" tier. However, referring to FIG. 2, in one embodiment, the single cartridge storage slots 16 are also termed "tier 0".

Referring again to FIGS. 1-3, according to one embodiment, the controller of automated data storage library 10 may operate the accessor(s) 18, 28 to selectively extract, place and/or transport data storage cartridges with respect to the multi-cartridge deep slot cells 100, storage slots 16, tape drives 15, and/or other elements of the automated data storage library 10. For example, the controller may facilitate extracting a cartridge from a multi-cartridge deep slot cell 100, transporting the cartridge to a data storage drive 15 and placing the cartridge in the drive 15. The controller may then facilitate extracting the cartridge from the data storage drive 15, while directing the accessor to transport the cartridge to a specific multi-cartridge deep slot cell 100 and place the cartridge therein.

In one embodiment, one or more data storage cartridges may be added into the library, e.g., at an I/O station 24, 25, whereby the controller of the automated data storage library 10 may then control and/or operate the accessor(s) 18, 28 to transport the cartridge(s) to specific multi-cartridge deep slot cell(s) 100, and place the cartridge(s) therein. Similarly, the controller may operate the accessor(s) to selectively extract, place and transport data storage cartridges with respect to the single cartridge storage slots 16, and/or transport inserted or added cartridge(s) to specific single cartridge storage slots 16.

Figure 9:
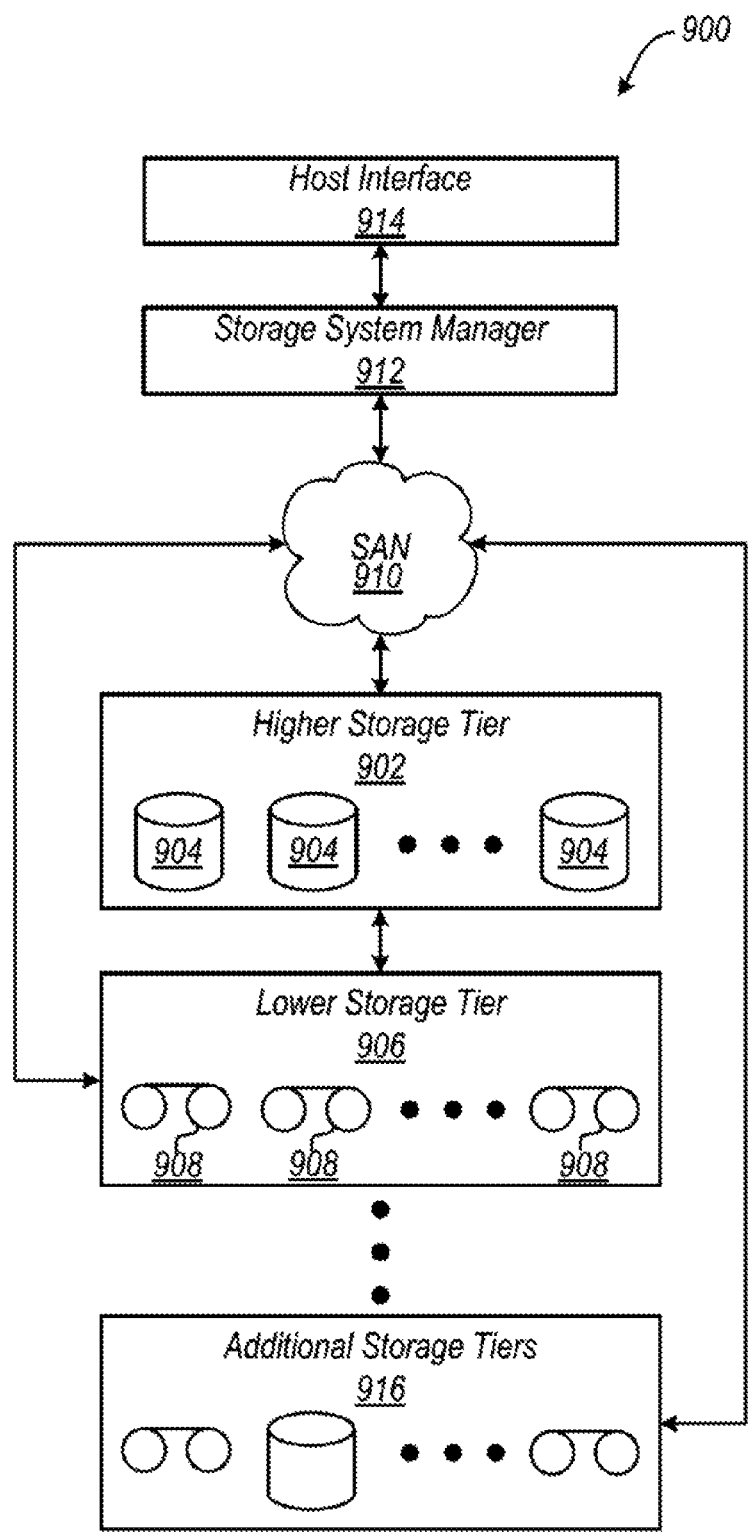
FIG. 9 is a tiered data storage system, in accordance with one embodiment.

Now referring to FIG. 9, a storage system 900 is shown according to one embodiment. Note that some of the elements shown in FIG. 9 may be implemented as hardware and/or software, according to various embodiments. In some approaches, the storage system 900 may be implemented in an automated data storage library such as that shown in FIGS. 1-2. In other approaches, an automated data storage library such as that shown in FIGS. 1-2 may be a tier of the storage system 900.

The storage system 900 may include a storage system manager 912 for communicating with a plurality of media on at least one higher storage tier 902 and at least one lower storage tier 906. The higher storage tier(s) 902 preferably may include one or more random access and/or direct access media 904, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 906 may preferably include one or more lower performing storage media 908, including sequential access media such as magnetic tape in tape drives and/or optical media, slower accessing HDDs, slower accessing SSDs, etc., and/or others noted herein or known in the art. One or more additional storage tiers 916 may include any combination of storage memory media as desired by a designer of the system 900. Also, any of the higher storage tiers 902 and/or the lower storage tiers 906 may include some combination of storage devices and/or storage media.

The storage system manager 912 may communicate with the storage media 904, 908 on the higher storage tier(s) 902 and lower storage tier(s) 906 through a network 910, such as a storage area network (SAN), as shown in FIG. 9, or some other suitable network type. The storage system manager 912 may also communicate with one or more host systems (not shown) through a host interface 914, which may or may not be a part of the storage system manager 912. The storage system manager 912 and/or any other component of the storage system 900 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 900 may include any number of data storage tiers, and may include the same or different data storage media within each storage tier. For example, each data storage tier may include the same type of data storage media, such as HDDs, SSDs, sequential access media (tape in tape drives, optical disk in optical disk drives, etc.), direct access media (CD-ROM, DVD-ROM, etc.), or any combination of data storage media types. In one such configuration, a higher storage tier 902, may include a majority of SSD storage media for storing data in a higher performing storage environment, and remaining storage tiers, including lower storage tier 906 and additional storage tiers 916 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 902, while data not having one of these attributes may be stored to the additional storage tiers 916, including lower storage tier 906. Of course, one of skill in the art, upon reading the present descriptions, may devise many other combinations of storage media types to implement into different storage schemes, according to the embodiments presented herein.

According to some embodiments, the storage system (such as 900) may include logic configured to receive a request to open a data set, logic configured to determine if the requested data set is stored to a lower storage tier 906 of a tiered data storage system 900 in multiple associated portions, logic configured to move each associated portion of the requested data set to a higher storage tier 902 of the tiered data storage system 900, and logic configured to assemble the requested data set on the higher storage tier 902 of the tiered data storage system 900 from the associated portions. Of course, this logic may be implemented as a method on any device and/or system or as a computer program product, according to various embodiments.

Figure 10:
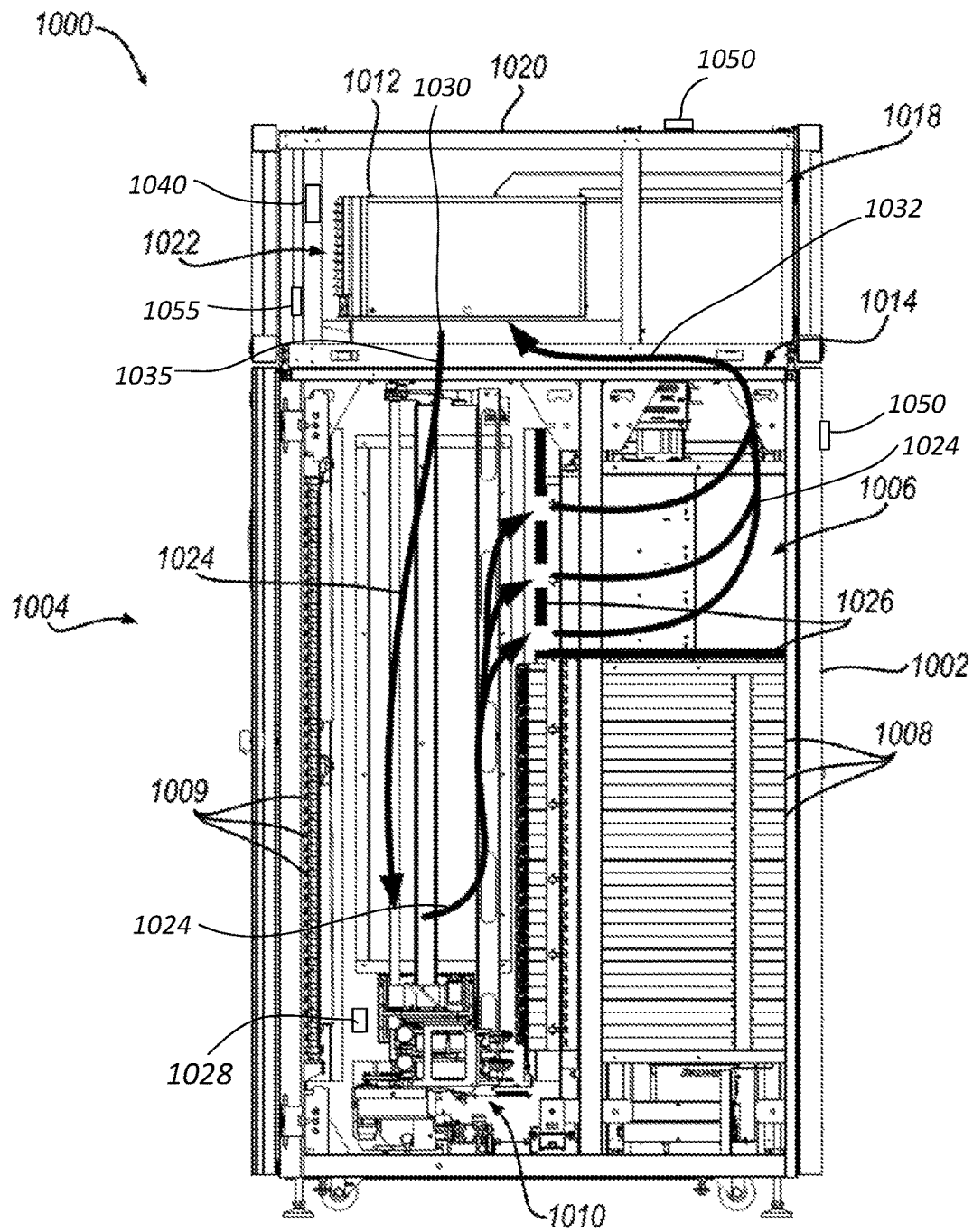
FIG. 10 is a partial side view of one embodiment of a system for storing magnetic recording media.

Referring now to FIG. 10, a system 1000 includes a frame 1002 of an automated data storage library 1004. As described above, automated libraries are typically used to store cartridges and drives in large arrays to store large amounts of data. Thus, an interior of frame 1002 is illustrated as a tape library in one embodiment, and is depicted as including one or more tape drives 1006, an area for storing tape cartridges (e.g., multi-cartridge deep slot cells 1008 and single cartridge storage slots 1009), and a robotic accessor 1010, among other components which would be apparent to one skilled in the art upon reading the present description (e.g., see FIG. 2 above).

Automated libraries have traditionally operated in environments having ideal temperature and humidity levels within the operational specifications of the data storage media and drives. As such, automated libraries have previously relied on outside air to flow through the library to keep the drives and data storage media cool as drives heat the air during the process of normal operation (e.g., such as reading and writing data to data storage media). However, as mentioned above, this limits the number of environments an automated data storage library can be implemented in. If the air outside the library is not cool or dry enough, exposing the interior of the library thereto may be harmful to the data storage media and/or the drives. One type of automated library which may be susceptible to exposure to environmental conditions, such as, for example, high heat and/or humidity, are automated tape libraries containing tape media and tape drives.

System 1000 of FIG. 10 further includes an optional integrated environmental conditioning unit 1012 coupled to the frame 1002. For the purposes of the present disclosure, it is to be understood that an environmental conditioning unit may be any device which conditions the air and/or the surrounding environment and is able to change the environmental conditions. The environmental conditions may include (but are not limited to) temperature, humidity, pressure, etc. In one embodiment the environmental conditioning unit may be an air-conditioning unit. An environmental conditioning unit in accordance with the present disclosure may increase or decrease the temperature, humidity, pressure, etc. The environmental conditioning unit 1012 may be coupled to an upper surface 1014 (e.g., the roof) of the frame 1002 as shown in FIG. 1B and FIG. 10. This allows for the environmental conditioning unit 1012 to operate without negatively affecting the operating conditions in the frame 1002. However, an environmental conditioning unit may be functionally associated with the frame 1002 by positioning the environmental conditioning unit elsewhere and using ducts to route the air to the interior of the frame 1002, coupling the environmental conditioning unit to a side of the frame 1002, coupling the environmental conditioning unit to a bottom of the frame 1002 (underneath the frame 1002), etc., depending on the desired approach.

The environmental conditioning unit 1012 is preferably configured such that it may regulate the relative conditions (e.g., temperature, humidity, contaminant presence via filtering, etc.) inside the frame 1002. Thus, according to different approaches, the environmental conditioning unit may be able to reduce an ambient temperature of the interior of the frame 1002 and/or reduce the relative humidity of the interior of the frame 1002, depending on the type of environmental conditioning unit 1012 employed. The environmental conditioning unit 1012 is preferably configured to turn on and off as desired to maintain a selected temperature in the interior of the frame 1002. Alternatively, the environmental conditioning unit may have a fan and the fan can be left always on to keep air circulating within the interior of the frame. In one embodiment, the environmental conditioning unit may be an air conditioning unit and the fan may be continuously on and the condenser may turn on and off to maintain a selected temperature in the interior of the frame 1002.

As would be appreciated by one skilled in the art, the environmental conditioning unit 1012 may be an air conditioning unit and may be able to adjust the relative temperature and/or humidity of the interior of the frame 1002 in a conventional manner. Cold air may flow into the interior of the frame 1002 via an inlet air duct 1030 which may connect the environmental conditioning unit 1012 to the interior of the frame 1002, and form an airflow inlet 1035 in the upper surface 1014 of the frame 1002. Specifically, an inlet air duct 1030 may direct the air cooled by the environmental conditioning unit 1012 into the interior of the frame 1002, e.g., where the majority of the data storage media may be stored. As a result, air flow is created from the environmental conditioning unit 1012 to the interior of the frame 1002, as indicated by arrows 1024. This air flow may be induced by a fan included in the air conditioning unit 1012 and/or by using the fans in the one or more tape drives 1006, as will be described in further detail below.

Once in the interior of the frame 1002, the air flow may extend past the multi-cartridge deep slot cells 1008 and single cartridge storage slots 1009, eventually being carried past and/or through the one or more tape drives 1006. Thus, the air being cycled through the environmental conditioning unit transfers heat from interior of the frame 1002 and the tape drives 1006. A baffle or baffles 1026 are preferably configured to isolate hot air produced by (e.g., exiting) the tape drives 1006 from the area for storing tape cartridges. In other words, a baffle or baffles 1026 are preferably configured to create hot and cold air separation in the interior of the frame 1002. As mentioned above, magnetic tape and other magnetic media degrade when exposed to undesirable (e.g., hot, humid, etc.) conditions. Thus, it is preferred to prevent the heat produced by the tape drives 1006 from returning to the area for storing tape cartridges.

The air flow is preferably directed through the gaps in the vertical baffle, allowing the conditioned air to flow through each of the tape drives 1006. The gaps in the vertical baffle may also be used by the robotic accessor 1010 to place tape cartridges into the tape drives 1006. Moreover, the horizontal baffle 1026 is preferably used to prevent air from flowing to the multi-cartridge deep slot cells 1008 once passed through the tape drives 1006. The air exiting the tape drives is hot (e.g., at least hotter than when it left the environmental conditioning unit 1012), and may negatively affect exposed magnetic tape. Thus, air exiting the tape drives 1006 is preferably directed back to the environmental conditioning unit 1012 to be conditioned (cooled, dehumidified, filtered, etc.) for further use as would be appreciated by one skilled in the art upon reading the present description. Although the air flow is preferably directed from the environmental conditioning unit 1012 to the interior of the frame 1002, and from the interior of the frame 1002 back to the environmental conditioning unit 1012, the particular path that the air flow is shown as extending along in the present embodiment by arrows 1024 is in no way intended to limit the disclosure or the invention.

With continued reference to FIG. 10, system 1000 may include an enclosure 1020 for the environmental conditioning unit 1012. An additional fan 1040 may be included in the enclosure 1020 for passing ambient air over external components of the environmental conditioning unit 1012 to further promote heating, cooling and/or conditioning of the air. Moreover, the enclosure 1020 may include an opening, a baffle or baffles, etc. to direct ambient air exterior to the library 1004 toward an inlet 1022 of the environmental conditioning unit 1012.

Any vents, voids, seams, etc. in the frame 1002 of the library 1004, other than inlet 1035 and an outlet 1032 in an upper surface 1014 of the frame 1002, are preferably sealed such that air from outside the frame 1002 cannot reach the interior thereof. This may effectively seal the frame 1002 of the automated data storage library 1004 such that the air flow circulating through the environmental conditioning unit 1012 is the only air moving into and out of the interior of the frame 1002. As a result, tape drives 1006, magnetic tape media stored in the library 1004, etc., or other components in the frame 1002 may be isolated from the environment external of the frame 1002 and/or library 1004 and any unfavorable conditions which may be associated therewith. The frame 1002 may be sealed using any processes which would be apparent to one skilled in the art upon reading the present description, e.g., including but not limited to inserting foam, implementing insulating seals, etc. New frames may be built without any vents, voids, seams, etc. The housing and panels enclosing the frame 1002 may also be insulated to prevent or inhibit unconditioned air from entering the frame 1002.

The frame 1002 may also include one or more environmental sensors 1050 exterior to the library 1004 and may also include one or more sensors 1055 exterior to the library 1004 but inside the enclosure 1020 for the environmental conditioning unit 1012. In one embodiment the sensors 1055 may be located in front of inlet 1022 of the environmental conditioning unit 1012. The environmental sensors 1050, 1055 may be any sensor appropriate for determining the environmental conditions at the sensor location, such as one or more temperature sensors, one or more humidity sensors, one or more pressure sensors, etc. The one or more environmental sensors 1050, 1055 may be in communication with a library controller, such as library controller 400 shown and described with respect to FIG. 4. The one or more signals provided by the environmental sensors 1050, 1055 may be utilized to control the output and operation of the environmental conditioning unit 1012.

System 1000 illustrated in FIG. 10 may further comprise one or more environmental sensors 1028 disposed within the interior of the library 1002. The environmental sensor(s) may be any appropriate sensor for determining the environmental conditions within the frame 1002, such as one or more temperature sensors, one or more humidity sensors, one or more pressure sensors, etc. The one or more environmental sensors 1028 may be in communication with a library controller, such as controller 400 shown and described with respect to FIG. 4. As such, the signal provided by the one or more environmental sensors 1028 may be utilized to control the output of the environmental conditioning unit 1012.

Although the embodiment illustrated in FIG. 10 includes a single frame 1002 and a single environmental conditioning unit 1012, other embodiments may include additional frames and/or environmental conditioning units.

While a data storage library having an associated and/or integrated air conditioning unit advantageously controls the environmental conditions within the library, some challenges may exist when components within such a data storage library need to be serviced or replaced. As noted above, many data centers are now maintained at higher temperatures and higher humidity levels to reduce the costs relating to cooling the data center. For this reason, environmental conditions of the data center may be substantially different from those within a data storage library having associated environmental air conditioning unit. As such, a component (e.g., a tape drive, data storage cartridge, library control card, other communication cards, etc.) that is moved from the warm, humid environment of the data center to the cool, dry environment of the data storage library may necessitate a period of time in which to acclimate to the environmental conditions within the data storage library. For example, it may be desirable to acclimate one or more data storage cartridges for a period of time (e.g., 24 hours) prior to active use within the data storage library in order to avoid errors in a read/write operation due to the temperature-based expansion and/or contraction of the data storage cartridge(s). Additionally, access into the data storage library via a door, panel, or other opening may introduce an influx of external air into the interior of the library, which may cause condensation formation and/or accumulation on components within the library. Moisture build-up on surfaces of sensitive components such as data storage cartridges and tape drives is undesirable, as moisture may lead to adverse effects and, in some situations, failure of the components and/or data loss.

Thus, in accordance with aspects of the present disclosure, one or more component lockers for acclimation of service and/or replacement components may be incorporated into at least one library frame of the data storage library so as to maintain replacement components at environmental conditions substantially similar to those of the data storage library.

In an aspect of the present disclosure, the one or more component lockers may be formed in an unused portion of a library frame, such as a rear bottom portion of the library frame. The service and/or replacement component(s) may be replenished within the one or more component lockers when the environmental conditions within the library frame(s) are substantially similar to the ambient environmental conditions outside of the data storage library (e.g. the data center) so as to inhibit, resist and/or avoid the formation and/or accumulation of condensation on the components upon entry into the component locker(s). When needed for service and/or replacement purposes, the component(s) within the component locker will have already acclimated to the environmental conditions within the library frame(s), thereby preventing the components from experiencing thermal shock and/or the formation and/or accumulation of condensation.

Figure 11:
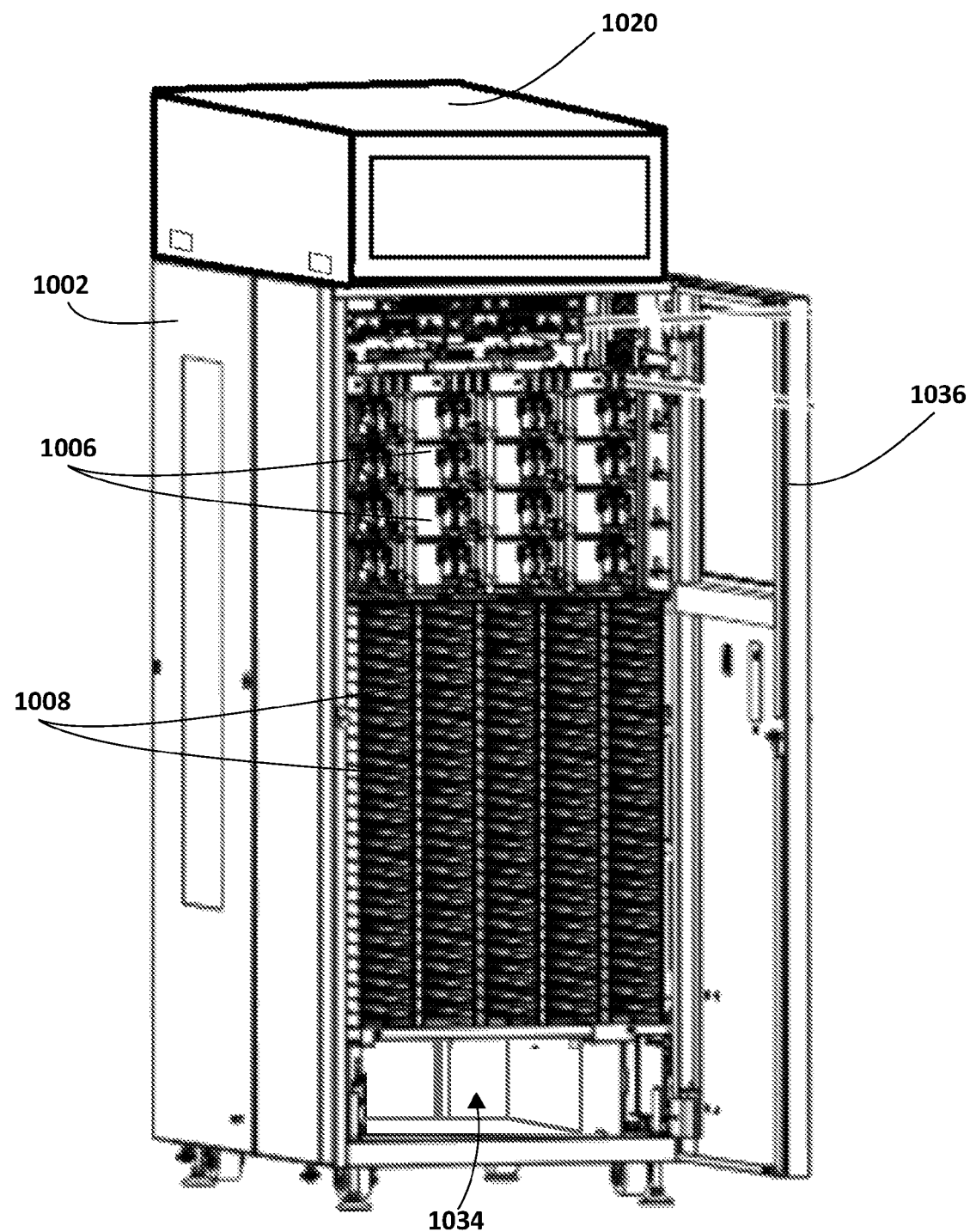
FIG. 11 is a rear perspective view of one embodiment of a storage frame from a data storage library.

Referring to FIG. 11, a rear perspective view of frame 1002 in accordance with an aspect of the present disclosure is illustrated. As described above with respect to FIG. 10, frame 1002 comprises one or more tape drives 1006, as well as one or more multi-cartridge deep slot storage cells 1008, both of which are at least partially accessible either through entry via a front door (as shown in FIG. 2) or through a rear door 1036. An enclosure 1020 on the top portion of frame 1002 may optionally be configured to house an environmental conditioning unit (not shown), which provides conditioned air to the interior of frame 1002, as described above with respect to FIG. 10. The rear door 1036 allows access to the rear portion of frame 1002, whereby an operator may access rear portions of tape drives 1006, multi-cartridge deep slot storage cells 1008, and other components within the frame 1002, such as one or more power supplies, frame controllers, tape drive cable connections, etc.

While much of the internal space within frame 1002 is occupied by tape drives 1006, multi-cartridge deep slot storage cells 1008, and other componentry, there may be regions within frame 1002 that are typically vacant and unused by active components of the data storage library. For instance, portions at the rear and bottom of frame 1002 may be substantially empty. As such, in accordance with an aspect of the disclosure, such unoccupied regions of frame 1002 may be utilized to form a component locker 1034 for the storage of service and/or replacement components such as tape drives, library control cards, communication cards, data storage cartridges, etc. As component locker 1034 is within frame 1002 and at least partially accessible to the conditioned air from the environmental conditioning unit associated with the data storage library, component locker 1034 may be subjected to the same environmental conditions as the rest of the interior of frame 1002. As such, any service and/or replacement components stored therein for a suitable amount of time have had an opportunity to acclimate to the interior environmental conditions of the data storage library prior to their distribution as an active component of the data storage library.

As the component locker 1034 preferably may be disposed at a location in the rear and bottom portion of frame 1002 in the vicinity of rear door 1036, an operator may easily access the component locker 1034 for retrieval and/or restocking of replacement components. As the component locker 1034 is accessible by rear door 1036, the amount of time that door 1036 must be open to retrieve and/or restock replacement components may be minimal, which helps to lessen the infiltration of ambient environmental conditions into the controlled environment of the frame 1002. In this way, the potential for condensation accumulation on sensitive components within frame 1002 due to the infiltration of warm, humid air from the data center may be reduced. The component locker 1034 may be an enclosure for holding the extra replacement components and may have an opening for loading the extra replacement components and a separate door for closing the opening.

In an aspect of the disclosure, the component storage locker 1034 is accessed and supplied with replacement party while the data storage library system or at least the data storage library frame where the component storage locker 1034 is located, is unoperational, is undergoing schedule maintenance, is undergoing extensive repairs, and/or its interior environmental conditions have been adjusted to be at and/or within a desired range of the environmental conditions outside the library system, or the library frame. When the maintenance and/or repairs are completed, or the library is otherwise ready to go back on-line, the data storage library system and/or frame that contains the component storage locker may be acclimated slowly and the environmental conditions within the component storage locker and the components retained in the storage locker preferably will adjust slowly and in a manner that resists, inhibits and/or avoids thermal shock and/or the formation of condensation.

While the component locker 1034 is shown to be located at a rear, bottom portion of frame 1002 in FIG. 11, it is to be understood that the component locker 1034 may be located in any suitable, unused location within frame 1002. Furthermore, the component locker 1034 may be configured to be accessed by an operator, an accessor, or both. In one embodiment, an operator may place one or more components within the component locker 1034 and later retrieve the one or more components for manual replacement within the frame 1002. In another embodiment, an accessor (e.g., accessor 1010 shown in FIG. 10) may place one or more components within the component locker 1034 and later retrieve the one or more components. In yet another embodiment, an operator may place one or more components within the component locker 1034, while an accessor may later retrieve the one or more components within the component locker 1034, or vice versa.

Figure 12:
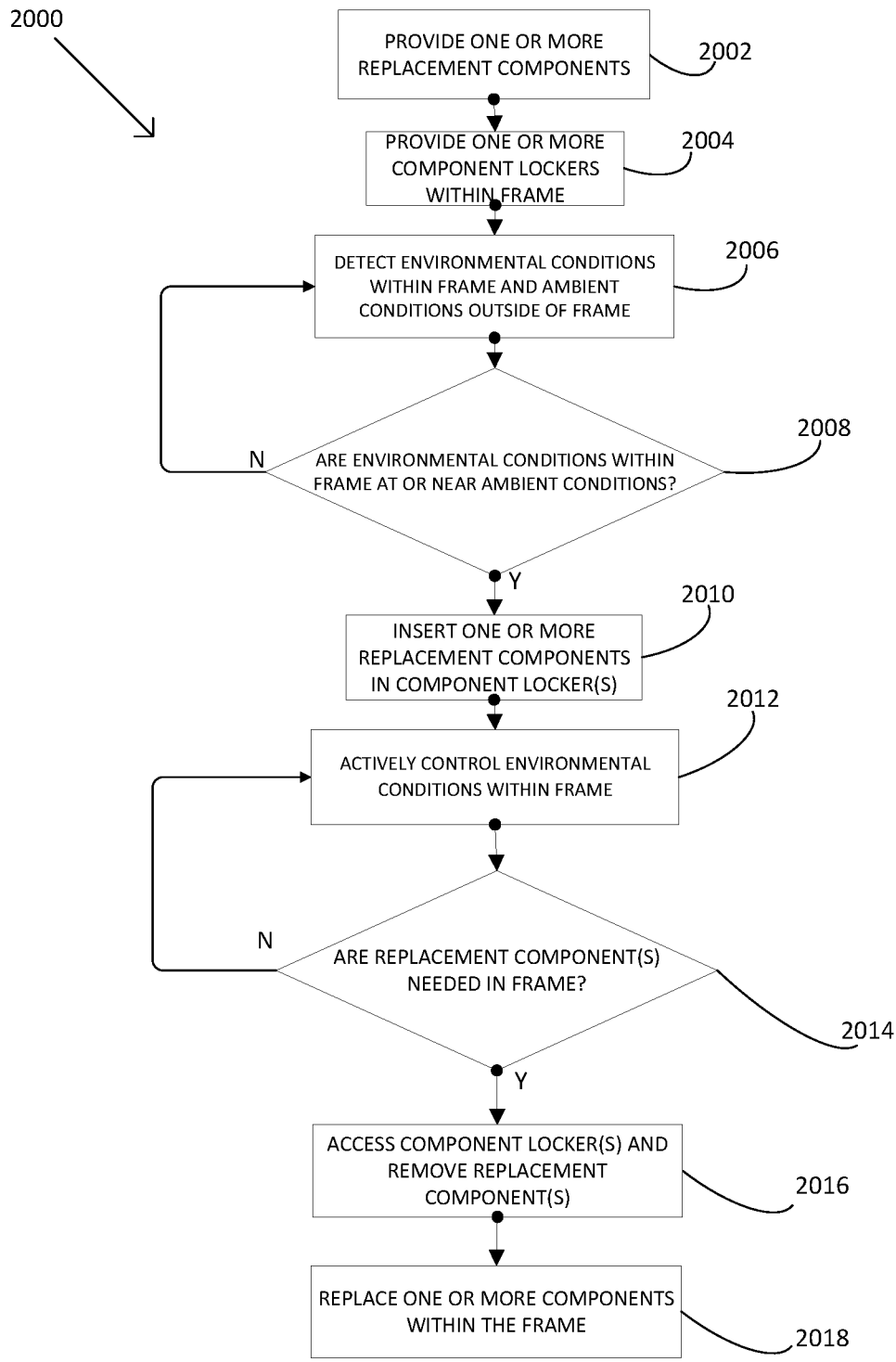
FIG. 12 is a flowchart of one embodiment of a method for acclimating and replacing at least one component in an automated data storage library.

Next, referring to FIG. 12, a component replacement process 2000 in accordance with another aspect of the present disclosure is illustrated. While the process may, for convenience, be described as a series and/or number of steps, it will be appreciated that the process may be performed as an integrated process, a series of steps, in the order described or in an alternative order. First, at 2002, one or more replacement components are provided. The one or more replacement components may be any component usable within a frame of a data storage library, such as tape drives, library control cards, communication cards, data storage cartridges, etc. Next, at 2004, one or more component lockers are provided within the frame of the data storage library, with the one or more component lockers. The component locker in one embodiment is configured to have environmental conditions maintained at or near the same conditions as the other interior portions of the data storage library frame. At 2006, optionally the environmental conditions within the frame are determined, as are the ambient conditions outside of the data storage library frame (e.g., the ambient conditions of the data center). The environmental conditions may be determined by any appropriate means, such as by one or more environmental sensors (e.g., temperature and/or humidity sensors). Next, a determination is made if the environmental conditions within the frame are at, near or within a desired range of the ambient conditions at 2008. If the environmental conditions within the data storage library are not suitable, the environmental conditions both within the frame and outside of the frame are continued to be monitored/detected. However, if the environmental conditions within the data storage library are suitable (e.g., within desired range), one or more replacement components may be inserted into the component locker(s) at 2010. As the environmental conditions within the frame are at or near the ambient environmental conditions, insertion of the replacement component(s) into the component locker(s) shall not cause condensation formation/accumulation and/or thermal shock on the inserted components.

At 2012, the environmental conditions (e.g., the temperature and/or humidity levels) within the frame are actively controlled so as to bring the frame to suitable operational levels. As the one or more component lockers are in communication with the internal environmental conditions of the frame, the replacement component(s) placed therein also experience the same changes in environmental conditions. In one embodiment, the environmental conditions within the frame are gradually changed so as to allow the all components (e.g., operational and extra replacement parts within storage locker) to properly acclimate to the suitable operational conditions.

At 2014, a determination is made whether or not replacement component(s) are needed within the frame. Such a determination may be made via any suitable method, such as by active monitoring of components by a library controller, scheduled replacement/maintenance by an operator, etc. If yes, the component locker(s) are accessed and one or more replacement components are retrieved/removed from the component locker(s) at 2016. As detailed above, access and removal of replacement components may be achieved by an operator, an accessor within the frame, or both. Finally, at 2018, one or more components is replaced at an appropriate location within the frame, either by an operator or by an accessor.

It follows that various embodiments described and/or suggested herein are able to provide data storage systems, more specifically, automated data storage libraries having climate control capabilities associated with and/or integrated with the automated data storage library, with at least one frame of the automated data storage library having at least one component locker for storage of replacement component(s) therein. As a result, favorable conditions (e.g., temperature, humidity, presence of contaminants, etc.) may be maintained for the tape drives, data storage cartridges, controller cards, communication cards, etc., which may be stored in the component storage locker in the at least one library frame, while formation and/or accumulation on the components within the storage locker, as well as all operational components may be inhibited, reduced and/or avoided. Moreover, a data storage library may be serviced with parts at an appropriate temperature, humidity, contaminant level, etc. regardless of whether the library is installed in an unfavorable (e.g., hot and/or wet) location.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

A data processing system suitable for storing and/or executing program code may include at least one processor, which may be or be part of a controller, coupled directly or indirectly to memory elements through a system bus, such as controller 400 of FIG. 4. The memory elements can include local memory employed during actual execution of the program code, such as nonvolatile memory 404 of FIG. 4, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A data storage library system, the system comprising:
   at least one data storage library, the at least one data storage library comprising at least one library frame, wherein at least one environmental conditioning unit is associated with the at least one frame, the at least one environmental conditioning unit configured to control at least one environmental condition within the at least one library frame; and
   at least one component locker housed in an interior portion of the at least one library frame,
   wherein the at least one component locker is configured to retain at least one replacement component for use in the at least one data storage library, and further wherein the at least one environmental conditioning unit is configured to adjust at least one environmental condition within the at least one component locker to be within a desired range of at least one environmental condition outside of the at least one library frame prior to insertion of the at least one replacement component into the at least one component locker.

2. The data storage library system of claim 1, wherein the at least one environmental conditioning unit is configured to maintain the at least one environmental condition within the at least one component locker to be similar to the environmental conditions within other interior portions of the at least one library frame.

3. The data storage library system of claim 1, wherein the at least one component locker is located within an unused portion of the at least one library frame.

4. The data storage library system of claim 1, wherein the at least one component locker is located at a bottom portion of the at least one library frame.

5. The data storage library system of claim 1, wherein the at least one component locker is located at a rear portion of the at least one library frame.

6. The data storage library system of claim 1, wherein the at least one component locker is accessible via a rear door of the at least one library frame.

7. The data storage library system of claim 1, wherein the at least one component locker is configured to be accessible by at least one of an operator and an accessor.

8. The data storage library system of claim 7, wherein the at least one component locker is manually replenishable by an operator.

9. The data storage library system of claim 1, wherein the one or more replacement components comprise at least one of a tape drive, a library control card, a communication card, and a data storage cartridge.

10. A system comprising:
a data storage library, the data storage library comprising at least one library frame and at least one environmental conditioning unit, the at least one environmental conditioning unit configured to control at least one environmental condition within the data storage library;
a front access door configured to allow access into a front interior portion of the at least one library frame;
a rear access door configured to allow access into a rear interior portion of at least one library frame, and
at least one component locker housed in the rear interior portion of the at least one library frame, wherein the at least one component locker is configured to retain at least one replacement component for use in the data storage library, and further wherein the at least one environmental conditioning unit is configured to adjust at least one environmental condition within the at least one component locker to be within a desired range of at least one environmental condition outside of the at least one library frame prior to insertion of the at least one replacement component into the at least one component locker.

11. The system of claim 10, wherein the at least one component locker is located at a bottom portion of the rear interior portion of the at least one library frame.

12. A method of acclimating one or more replacement components within a data storage library, the method comprising:
providing a data storage library having one or more library frames;
providing an environmental conditioning unit configured to control an environmental condition within the one or more library frames;
providing at least one component locker within a portion of the one or more library frames, the at least one component locker configured for storage of at least one replacement component for the one or more library frames;
providing one or more replacement components;
detecting an environmental condition within the one or more library frames and an ambient environmental condition outside of the one or more library frames;
adjusting the environmental condition within the one or more library frames such that the environmental condition within the one or more library frames is within a desired range of the ambient environmental condition;
inserting the one or more replacement components within the at least one component locker; and
incrementally adjusting the environmental condition within the one or more library frames such that the environmental condition within the one or more library frames reaches a predetermined operational condition.

13. The method of claim 12, further comprising determining if the one or more replacement components are needed within the one or more library frames.

14. The method of claim 13, further comprising accessing the at least one component locker to remove the one or more replacement components when it is determined that the one or more replacement components are needed within the one or more library frames.

15. The method of claim 14, wherein the step of accessing the at least one component locker to remove one or more replacement components is performed manually by an operator.

16. The method of claim 14, wherein the step of accessing the at least one component locker to remove one or more replacement components is performed automatically by an accessor.

17. The method of claim 13, wherein the step of determining if the one or more replacement components are needed is performed via active monitoring of components within the one or more library frames by a library controller.

18. The method of claim 13, wherein the step of determining if the one or more replacement components are needed is performed by an operator based on at least one of a scheduled replacement or maintenance procedure.

19. The method of claim 12, wherein the environmental condition within the one or more library frames and the ambient environmental condition outside of the one or more library frames is determined by at least one internal environmental sensor and at least one external environmental sensor.

20. The method of claim 12, wherein the environmental condition within the one or more library frames and the ambient environmental condition outside of the one or more library frames is at least one of a temperature condition and a humidity condition.

* * * * *